United States Patent
Hudson et al.

(10) Patent No.: US 9,543,158 B2
(45) Date of Patent: *Jan. 10, 2017

(54) TECHNIQUE TO DEPOSIT SIDEWALL PASSIVATION FOR HIGH ASPECT RATIO CYLINDER ETCH

(71) Applicant: Lam Research Corporation, Fremont, CA (US)

(72) Inventors: Eric A. Hudson, Berkeley, CA (US); Nikhil Dole, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/697,521

(22) Filed: Apr. 27, 2015

(65) Prior Publication Data

US 2016/0163557 A1 Jun. 9, 2016

(51) Int. Cl.
*H01L 21/3065* (2006.01)
*H01L 21/02* (2006.01)
(Continued)

(52) U.S. Cl.
CPC ..... *H01L 21/30655* (2013.01); *H01L 21/0217* (2013.01); *H01L 21/0228* (2013.01);
(Continued)

(58) Field of Classification Search
CPC .......... H01L 21/31116; H01L 21/31138; H01L 27/108; H01L 27/115; H01L 37/32009; H01L 37/32449; H01L 37/32899; H01L 21/3065; H01L 21/30655; C23C 16/45544; C23C 16/50; C23C 16/52

See application file for complete search history.

(56) References Cited

U.S. PATENT DOCUMENTS 4,894,696 A   1/1990   Takeda
5,767,018 A   6/1998   Bell
(Continued)

OTHER PUBLICATIONS

Briggs et al., "Technique to Deposit Sidewall Passivation for High Aspect Ratio Cylinder Etch," U.S. Appl. No. 15/157,303, filed May 17, 2016.
(Continued)

*Primary Examiner* — Duy Deo
(74) *Attorney, Agent, or Firm* — Weaver Austin Villeneuve & Sampson LLP

(57) ABSTRACT

Various embodiments herein relate to methods, apparatus and systems for forming a recessed feature in dielectric material on a substrate. Separate etching and deposition operations are employed in a cyclic manner. Each etching operation partially etches the feature. Each deposition operation forms a protective coating on the sidewalls of the feature to prevent lateral etch of the dielectric material during the etching operations. The protective coating may be deposited using methods that result in substantial preservation of a mask layer on the substrate. The protective coating may be deposited using particular reactants and/or reaction conditions that are unlikely to damage the mask layer. The protective coating may also be deposited using particular reaction mechanisms that result in substantially complete sidewall coating. In some cases the protective coating is deposited using plasma assisted atomic layer deposition, a modified plasma assisted atomic layer deposition, or plasma assisted chemical vapor deposition.

28 Claims, 12 Drawing Sheets

(51) Int. Cl.
  *H01L 21/308* (2006.01)
  *H01L 21/67* (2006.01)
  *H01L 21/687* (2006.01)
(52) U.S. Cl.
  CPC .. *H01L 21/02164* (2013.01); *H01L 21/02274* (2013.01); *H01L 21/3081* (2013.01); *H01L 21/67069* (2013.01); *H01L 21/68785* (2013.01); *H01L 21/0262* (2013.01); *H01L 21/02532* (2013.01)

(56) References Cited

U.S. PATENT DOCUMENTS

| | | | |
|---|---|---|---|
| 5,948,704 | A | 9/1999 | Benjamin et al. |
| 6,841,943 | B2 | 1/2005 | Vahedi et al. |
| 7,105,390 | B2 | 9/2006 | Brask et al. |
| 7,732,728 | B2 | 6/2010 | Dhindsa et al. |
| 7,740,736 | B2 | 6/2010 | Fischer et al. |
| 8,552,334 | B2 | 10/2013 | Tappan et al. |
| 9,378,971 | B1 * | 6/2016 | Hudson ............. H01L 21/31116 438/696 |
| 9,384,998 | B2 * | 7/2016 | Briggs ............. H01L 21/30655 438/696 |
| 2005/0136682 | A1 | 6/2005 | Hudson et al. |
| 2006/0121721 | A1 | 6/2006 | Lee et al. |
| 2007/0026677 | A1 | 2/2007 | Ji et al. |
| 2008/0286978 | A1 | 11/2008 | Chen et al. |
| 2009/0163035 | A1 | 6/2009 | Romano et al. |
| 2009/0275202 | A1 | 11/2009 | Tanaka et al. |
| 2010/0173494 | A1 * | 7/2010 | Kobrin ............. H01L 21/0337 438/694 |
| 2013/0316518 | A1 * | 11/2013 | Hollister ............. H01L 21/0245 438/478 |
| 2014/0038412 | A1 | 2/2014 | Hu et al. |
| 2015/0083582 | A1 * | 3/2015 | Dhindsa ............. H01L 21/3065 204/192.37 |
| 2016/0163556 | A1 | 6/2016 | Briggs et al. |
| 2016/0163558 | A1 | 6/2016 | Hudson et al. |
| 2016/0163561 | A1 | 6/2016 | Hudson et al. |
| 2016/0260617 | A1 | 9/2016 | Hudson et al. |
| 2016/0260620 | A1 | 9/2016 | Briggs et al. |
| 2016/0268141 | A1 | 9/2016 | Hudson |

OTHER PUBLICATIONS

Hudson et al., "Technique to Deposit Sidewall Passivation for High Aspect Ratio Cylinder Etch," U.S. Appl. No. 15/157,322, filed May 17, 2016.
Hudson et al., "Mask Shrink Layer for High Aspect Ratio Dielectric Etch," U.S. Appl. No. 14/842,733, filed Sep. 1, 2015.
Hudson, "Technique to Deposit Sidewall Passivation for High Aspect Ratio Cylinder Etch," U.S. Appl. No. 15/163,123, filed May 24, 2016.
US Office Action, dated Nov. 19, 2015, issued in U.S. Appl. No. 14/560,414.
US Notice of Allowance, dated Apr. 6, 2016, issued in U.S. Appl. No. 14/560,414.
US Final Office Action, dated Dec. 18, 2015, issued in U.S. Appl. No. 14/724,574.
US Notice of Allowance, dated Mar. 1, 2016, issued in U.S. Appl. No. 14/724,574.
Jung et al. (2005) "Vapor-Phase Self-Assembled Monolayer for Improved Mold Release in Nanoimprint Lithography," Langmuir, 21(4):1158-1161.
Zhuang et al. (2006) "Thermal stability of vapor phase deposited self-assembled monolayers for MEMS anti-stiction," J. Micromech. Microeng., 16:2259-2264.
Briggs, Joseph Scott, et al., "Technique to Deposit Sidewall Passivation for High Aspect Ratio Cylinder Etch", U.S. Appl. No. 14/560,414, filed Dec. 4, 2014.
Hausmann, Dennis Michael, Method of Conditioning Vacuum Chamber of Semiconductor Substrate Processing Apparatus, U.S. Appl. No. 14/446,427, filed Jul. 30, 2014.
Zhou, Han and Bent, Stacey F. (Jul./Aug. 2013) "Fabrication of organic interfacial layers by molecular layer deposition: Present status and future opportunities," Journal of Vacuum Science Technology A, American Vacuum Society, 31(4), pp. 040801-1-040801-18.
Hudson et al., "Technique to Deposit Sidewall Passivation for High Aspect Ratio Cylinder Etch," U.S. Appl. No. 14/724,574, filed May 28, 2015.
Hudson et al., "Technique to Deposit Metal-Containing Sidewall Passivation for High Aspect Ratio Cylinder Etch," U.S. Appl. No. 14/803,578, filed Jul. 20, 2015.
US Office Action, dated Sep. 8, 2015, issued in U.S. Appl. No. 14/724,574.
Yang et al. (2006) "CVD Growth Kinetics of $HfB_2$ Thin Films from the Single-Source Precursor $Hf(BH_4)_4$," Chem. Mater., American Chemical Society, 18(21):5088-5096.
Yanguas-Gil et al. (Sep./Oct. 2009) "Highly conformal film growth by chemical vapor deposition. II. Conformality enhancement through growth inhibition," Journal of Vacuum Science & Technology A, 27(5):1244-1248.
Hudson, "Technique to Deposit Sidewall Passivation for High Aspect Ratio Cylinder Etch," U.S. Appl. No. 15/225,489, filed Aug. 1, 2016.
US Office Action, dated Jul. 26, 2016, issued in U.S. Appl. No. 14/803,578.
US Office Action, dated Jun. 15, 2016, issued in U.S. Appl. No. 14/842,733.
Hanson et al. (2003) "Bonding Self-Assembled, Compact Organophosphonate Monolayers to the Native Oxide Surface of Silicon," J. Am. Chem. Soc.,125(51):16074-16080.
Hudson et al., "Technique to Deposit Sidewall Passivation For High Aspect Ratio Cylinder Etch," U.S. Appl. No. 15/364,101, filed Nov. 29, 2016.
US Notice of Allowance, dated Nov. 9, 2016, issued in U.S. Appl. No. 14/842,733.

* cited by examiner

TECHNIQUE TO DEPOSIT SIDEWALL PASSIVATION FOR HIGH ASPECT RATIO CYLINDER ETCH

CROSS REFERENCE TO RELATED APPLICATIONS

This application is a continuation-in-part of U.S. patent application Ser. No. 14/560,414, filed Dec. 4, 2014, and titled "TECHNIQUE TO DEPOSIT SIDEWALL PASSIVATION FOR HIGH ASPECT RATIO CYLINDER ETCH," which is herein incorporated by reference in its entirety and for all purposes.

BACKGROUND

One process frequently employed during fabrication of semiconductor devices is formation of an etched cylinder in dielectric material. Example contexts where such a process may occur include, but are not limited to, memory applications such as DRAM and 3D NAND structures. As the semiconductor industry advances and device dimensions become smaller, such cylinders become increasingly harder to etch in a uniform manner, especially for high aspect ratio cylinders having narrow widths and/or deep depths.

SUMMARY

Certain embodiments herein relate to methods and apparatus for forming an etched feature in dielectric material on a semiconductor substrate. In various cases, the methods may involve cycling between an etching step and a deposition step. During the deposition step, the disclosed embodiments may utilize certain techniques to deposit a passivating material on sidewalls of a partially etched feature, thereby allowing etch to occur at high aspect ratios while maintaining a desired maximum critical dimension within the etched feature. The passivating material may prevent laterally overetching the feature as it is etched deeper into the substrate.

In one aspect of the embodiments herein, a method is provided for forming an etched feature in dielectric material on a semiconductor substrate, the method including: (a) generating an etching plasma including an etching reactant, exposing the substrate to the etching plasma, and partially etching the feature in the dielectric material, where the substrate includes a mask layer; (b) after (a), depositing a protective film on sidewalls of the feature, where the protective film is deposited along substantially the entire depth of the feature, and where the mask layer is substantially preserved during (b); and (c) repeating (a)-(b) until the feature is etched to a final depth, where the protective film deposited in (b) substantially prevents lateral etch of the feature during (a), and where the feature optionally has an aspect ratio of about 5 or greater at its final depth.

The protective layer may be deposited in a variety of manners. In some embodiments, depositing the protective film includes: (i) flowing a first deposition reactant into a reaction chamber, generating a deposition plasma including the first deposition reactant, and exposing the substrate to the deposition plasma, where the first deposition reactant is a silicon-containing reactant, (ii) ceasing the flow of the first deposition reactant, (iii) flowing a second deposition reactant into the reaction chamber and generating or maintaining the deposition plasma to thereby drive a surface reaction between the first and second deposition reactants to form the protective film, the deposition plasma in (iii) including the second deposition reactant, where the mask layer is substantially preserved during (iii), and where a composition of the deposition plasma changes over the course of (i)-(iii), (iv) ceasing the flow of the second reactant, and (v) repeating (i)-(iv) until the protective film reaches a final thickness. In certain embodiments, the method may also include after (ii) and before (iii), flowing inert gas into the reaction chamber to sweep non-adsorbed first deposition reactant from the reaction chamber, and after (iv) and before a subsequent iteration of (i), flowing inert gas into the reaction chamber to sweep non-adsorbed second deposition reactant from the reaction chamber. In certain embodiments the deposition plasma is continuously maintained during (i)-(iii). In some other embodiments, the deposition plasma is not continuously maintained during (i)-(iii).

A number of different reactants may be used as described herein. In one embodiment, the first deposition reactant includes $SiCl_4$. In these or other cases, the second deposition reactant may include one or more reactants selected from the group consisting of: $COS$, $CO$, $SO_2$, $CO_2$, $NO$, $N_2O$, $N_2O_5$, $NO_2$, $N_2O_3$, $N_2O_4$, $H_2O$, $H_2CO$, $CS_2$, $CH_4$, $C_2H_4$, and $C_2H_6$. In various implementations, the second deposition reactant may include a sulfur-containing reactant. Such reactants may be particularly useful when used in combination with a mask layer that is sensitive to oxidation damage. In a particular embodiment, the mask layer is sensitive to oxidation damage, the first deposition reactant includes $SiCl_4$, and the second deposition reactant includes $COS$.

In a number of embodiments, the plasma conditions may be controlled to minimize the risk of damaging an oxidation sensitive layer. In some implementations, depositing the protective film includes exposing the substrate to a deposition plasma including a first deposition reactant during a first time period and a second deposition reactant during a second time period, where the deposition plasma is generated using HF RF power and optionally using LF RF power, where the LF RF power density, if LF RF power is used, is less than about 2,800 $W/m^2$ during the second time period. In some cases, the LF RF power density, if LR FR power is used, is less than about 700 $W/m^2$ during the second time period. The deposition plasma may be generated using only RF frequencies greater than about 2 MHz during the second time period in some cases.

The risk of damaging an oxidation sensitive layer may also be minimized in certain embodiments by limiting the amount of $O_2$ that is provided to the reaction chamber. For example in some embodiments the mask layer may be sensitive to oxidation damage, and depositing the protective film may include exposing the substrate to a deposition plasma generated from gas flowed into the reaction chamber, where the gas flowed into the reaction chamber includes less than about 20% $O_2$, as measured volumetrically.

In certain embodiments, depositing the protective film includes the following steps performed in a cyclic manner: (i) flowing a first deposition reactant into a reaction chamber and allowing the first deposition reactant to adsorb onto the substrate surface, where the first deposition reactant is a silicon-containing reactant; and (ii) flowing a second deposition reactant into the reaction chamber, where the first and second deposition reactants react to form the protective film. Depositing the protective film in some cases occurs through a plasma assisted atomic layer deposition reaction that includes (i), (ii), and (iii) generating a deposition plasma in the reaction chamber and exposing the substrate to the deposition plasma to drive a surface reaction between the first and second deposition reactants to thereby form the protective film, where (i)-(iii) are performed cyclically.

In some other cases, depositing the protective film includes flowing a first deposition reactant and second deposition reactant into a reaction chamber concurrently, generating a deposition plasma including the first and second deposition reactants, and exposing the substrate to the deposition plasma to thereby deposit the protective film. In some such cases, the first deposition reactant includes SiCl$_4$ and the second deposition reactant includes carbonyl sulfide.

The methods and apparatus disclosed herein can be used to etch a feature to a high aspect ratio while maintaining a high quality etch profile. In some embodiments, at the final depth the feature may have (i) an aspect ratio of about 20 or greater, and (ii) a maximum critical dimension that is no more than about 10% greater than the critical dimension at the bottom of the feature.

The method may be practiced in various contexts. In some cases the feature may be formed in the context of forming a VNAND device, and the dielectric material may include alternating layers of (i) a silicon oxide material, and (ii) a silicon nitride material or polysilicon material. In some other cases the feature may be formed in the context of forming a DRAM device, and the dielectric material may include silicon oxide. In some cases, the feature may have an aspect ratio of about 20 or greater, about 30 or greater, about 40 or greater, or about 50 or greater at its final depth.

In various cases, (a) and (b) are repeated at least one time, at least two times, at least three times, or at least five times. In some such cases, (b) may or may not be performed using the same reactants during each iteration. The mask layer may be sensitive to oxidation in some cases. For example, in some embodiments the mask layer includes spin-on carbon, amorphous carbon, and/or photoresist.

In another aspect of the disclosed embodiments, a method of depositing a silicon-containing film is provided. The method may include (a) flowing a first reactant into a reaction chamber and exposing the substrate to the first reactant, where the first reactant includes a silicon-containing reactant; (b) flowing a second reactant into a reaction chamber and exposing the substrate to the second reactant, where the second reactant includes carbonyl sulfide (COS); and (c) reacting the first and second reactant to thereby deposit the silicon-containing film on the substrate.

In certain implementations, the first and second reactants may be introduced to the reaction chamber cyclically. The first and/or second reactants may be delivered to the reaction chamber while the substrate is exposed to plasma in some cases. In one example, the method may further include generating plasma and exposing the substrate to plasma, where the composition of the plasma changes over time such that during a first stage the plasma includes the first reactant but not the second reactant, during a second stage the plasma includes inert gas and neither the first nor second reactant, and during a third stage the plasma includes the second reactant but not the first reactant, the first, second, and third stages occurring in that order, the method further including cyclically repeating the first, second, and third stages until the protective film reaches a final thickness.

Where plasma is used, it may or may not be extinguished during the deposition. In some cases, the plasma is extinguished at least once after the first reactant is delivered and before the second reactant is delivered. In these or other cases, the method may further include a fourth stage where the plasma is extinguished, the fourth stage occurring after the third stage, where the first, second, third, and fourth stages are cyclically repeated until the protective film reaches the final thickness.

In some embodiments, the method includes performing (a) while no plasma is present in the reaction chamber, and the method is adsorption-limited. In some other embodiments, (a) and (b) occur concurrently, and the reaction between the first and second reactants is a chemical vapor deposition reaction. In various embodiments, the substrate may include an exposed layer that is sensitive to oxidation damage.

In a further aspect of the disclosed embodiments, an apparatus for forming an etched feature in dielectric material on a semiconductor substrate is provided, the apparatus including: one or more reaction chambers, where at least one reaction chamber is designed or configured to perform etching, and where at least one reaction chamber is designed or configured to perform deposition, each reaction chamber including: an inlet for introducing process gases to the reaction chamber, an outlet for removing material from the reaction chamber, and a plasma source; and a controller having instructions for: (a) generating a first plasma including an etching reactant, exposing the substrate to the first plasma, and partially etching the feature in the dielectric material, where (a) is performed in the reaction chamber designed or configured to perform etching; (b) after (a), depositing a protective film on sidewalls of the feature, where the protective film is deposited along substantially the entire depth of the feature, where (b) occurs while substantially preserving a mask layer on the substrate, and where (b) is performed in the reaction chamber designed or configured to perform deposition; (c) repeating (a)-(b) until the feature is etched to a final depth, where the protective film deposited in (b) substantially prevents lateral etch of the feature during (a), and where the feature has an aspect ratio of about 5 or greater at its final depth.

In certain embodiments, the reaction chamber designed or configured to perform etching may be the same reaction chamber designed or configured to perform deposition, such that both (a) and (b) occur in the same reaction chamber. In some other embodiments, the reaction chamber designed or configured to perform etching may be different from the reaction chamber designed or configured to perform deposition, and the controller may further include instructions to transfer the substrate between the reaction chamber designed or configured to perform etching and the reaction chamber designed or configured to perform deposition.

These and other features will be described below with reference to the associated drawings.

DETAILED DESCRIPTION

Figure 1:
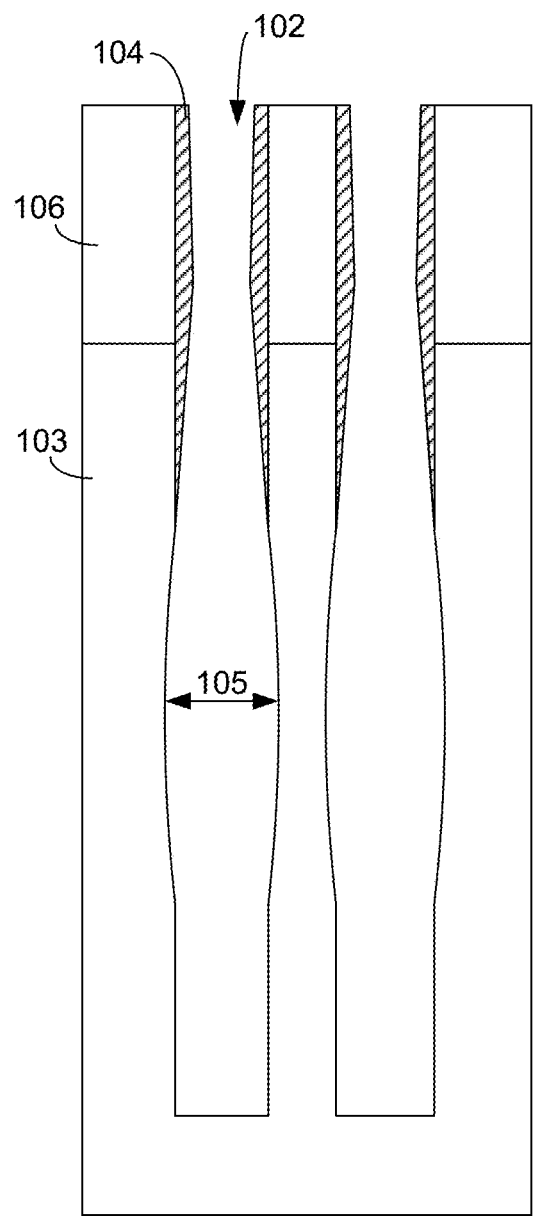
FIG. 1 illustrates an etched cylinder having an undesirable bow due to over-etching of the sidewalls.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micro-mechanical devices and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

I. Technology for Etching High Aspect Ratio Features in a Dielectric Material

Fabrication of certain semiconductor devices involves etching features into a dielectric material or materials. The dielectric material may be a single layer of material or a stack of materials. In some cases a stack includes alternating layers of dielectric material (e.g., silicon nitride and silicon oxide). One example etched feature is a cylinder, which may have a high aspect ratio. As the aspect ratio of such features continues to increase, it is increasingly challenging to etch the features into dielectric materials. One problem that arises during etching of high aspect ratio features is a non-uniform etching profile. In other words, the features do not etch in a straight downward direction. Instead, the sidewalls of the features are often bowed such that a middle portion of the etched feature is wider (i.e., further etched) than a top and/or bottom portion of the feature. This over-etching near the middle portion of the features can result in compromised structural and/or electronic integrity of the remaining material. The portion of the feature that bows outwards may occupy a relatively small portion of the total feature depth, or a relatively larger portion. The portion of the feature that bows outward is where the critical dimension (CD) of the feature is at its maximum. The critical dimension corresponds to the diameter of the feature at a given spot. It is generally desirable for the maximum CD of the feature to be about the same as the CD elsewhere in the feature, for example at or near the bottom of the feature.

Without being bound by any theory or mechanism of action, it is believed that the over-etching at the middle portion of the cylinder or other feature occurs at least partially because the sidewalls of the cylinder are insufficiently protected from etching. Conventional etch chemistry utilizes fluorocarbon etchants to form the cylinders in the dielectric material. The fluorocarbon etchants are excited by plasma exposure, which results in the formation of various fluorocarbon fragments including, for example, CF, $CF_2$, and $CF_3$. Reactive fluorocarbon fragments etch away the dielectric material at the bottom of a feature (e.g., cylinder) with the assistance of ions. Other fluorocarbon fragments are deposited on the sidewalls of the cylinder being etched, thereby forming a protective polymeric sidewall coating. This protective sidewall coating promotes preferential etching at the bottom of the feature as opposed to the sidewalls of the feature. Without this sidewall protection, the feature begins to assume a non-uniform profile, with a wider etch/cylinder width where the sidewall protection is inadequate.

Sidewall protection is especially difficult to achieve in high aspect ratio features. One reason for this difficulty is that existing fluorocarbon-based processes cannot form the protective polymeric sidewall coating deep in the cylinder being etched. FIG. 1 presents a figure of a cylinder 102 being etched in a dielectric material 103 coated with a patterned mask layer 106. While the following discussion sometimes refers to cylinders, the concepts apply to other feature shapes such as rectangles and other polygons. A protective polymeric sidewall coating 104 is concentrated near the top portion of the cylinder 102. $C_xF_y$ chemistry provides both the etch reactant(s) for etching the cylinder vertically, as well as the reactant(s) that form the protective polymeric sidewall coating 104. Because the protective polymeric sidewall coating 104 does not extend deep into the cylinder (i.e., there is insufficient deposition on the sidewall), the middle portion of the cylinder 102 becomes wider than the top portion of the cylinder 102. The wider middle portion of the cylinder 102 is referred to as the bow 105, or as the maximum CD. The bow can be numerically described in terms of a comparison between the critical dimension of the feature at the bow region and the critical dimension of the feature below the bow region. The bow may be numerically reported in terms of distance (e.g., the critical dimension at the widest part of the feature minus the critical dimension at the narrowest part of the feature below the bow) or in terms of a ratio/percent (the critical dimension at the widest part of the feature divided by the critical dimension at the narrowest part of the feature below the bow). This bow 105, and the related non-uniform etch profile, is undesirable. Because of the high ion energies often used in this type of etching process, bows are often created when etching cylinders of high aspect ratios. In some applications, bows are created even at aspect ratios as low as about 5. As such, conventional fluorocarbon etch chemistry is typically limited to forming relatively low aspect ratio cylinders in dielectric materials.

Some modern applications require cylinders having higher aspect ratios than those that can be achieved with conventional etch chemistry.

II. Context and Applications

In various embodiments herein, features are etched in a substrate (typically a semiconductor wafer) having dielectric material on the surface. The etching processes are generally plasma-based etching processes. The overall feature formation process may occur in stages: one stage directed at etching the dielectric material and another stage directed at forming a protective sidewall coating without substantially etching the dielectric material. The protective sidewall coating passivates the sidewalls and prevents the feature from being over-etched (i.e., the sidewall coating prevents lateral etch of the feature). These two stages can be repeated until the feature is etched to its final depth. By cycling these two stages, the diameter of the feature can be controlled over the entire depth of the feature, thereby forming features having more uniform diameters/improved profiles.

A feature is a recess in the surface of a substrate. Features can have many different shapes including, but not limited to, cylinders, rectangles, squares, other polygonal recesses, trenches, etc.

Aspect ratios are a comparison of the depth of a feature to the critical dimension of the feature (often its width/diameter). For example, a cylinder having a depth of 2 μm and a width of 50 nm has an aspect ratio of 40:1, often stated more simply as 40. Since the feature may have a non-uniform critical dimension over the depth of the feature, the aspect ratio can vary depending on where it is measured. For instance, sometimes an etched cylinder may have a middle portion that is wider than the top and bottom portions. This wider middle section may be referred to as the bow, as noted above. An aspect ratio measured based on the critical dimension at the top of the cylinder (i.e., the neck) would be higher than an aspect ratio measured based on the critical dimension at the wider middle/bow of the cylinder. As used herein, aspect ratios are measured based on the critical dimension proximate the opening of the feature, unless otherwise stated.

The features formed through the disclosed methods may be high aspect ratio features. In some applications, a high aspect ratio feature is one having an aspect ratio of at least about 5, at least about 10, at least about 20, at least about 30, at least about 40, at least about 50, at least about 60, at least about 80, or at least about 100. The critical dimension of the features formed through the disclosed methods may be about 200 nm or less, for example about 100 nm or less, about 50 nm or less, or about 20 nm or less.

The material into which the feature is etched may be a dielectric material in various cases. Example materials include, but are not limited to, silicon oxides, silicon nitrides, silicon carbides, oxynitrides, oxycarbides, carbonitrides, doped versions of these materials (e.g., doped with boron, phosphorus, etc.), and laminates from any combinations of these materials. Particular example materials include stoichiometric and non-stoichiometric formulations of $SiO_2$, SiN, SiON, SiOC, SiCN, etc. The material or materials that are etched may also include additional elements, including but not limited to hydrogen. In some embodiments, a nitride and/or an oxide material being etched will have a composition that includes hydrogen. As used herein, it is understood that silicon oxide materials, silicon nitride materials, etc. include both stoichiometric and non-stoichiometric versions of such materials, and that such materials may have other elements included, as described above.

One application for the disclosed methods is in the context of forming a DRAM device. In this case, the feature may be etched primarily in silicon oxide. The substrate may also include one, two, or more layers of silicon nitride, for instance. In one example, a substrate includes a silicon oxide layer sandwiched between two silicon nitride layers, with the silicon oxide layer being between about 800-1200 nm thick and one or more of the silicon nitride layers being between about 300-400 nm thick. The etched feature may be a cylinder having a final depth between about 1-3 μm, for example between about 1.5-2 μm. The cylinder may have a width between about 20-50 nm, for example between about 25-30 nm. After the cylinder is etched, a capacitor memory cell can be formed therein.

Another application for the disclosed methods is in the context of forming a vertical NAND (VNAND, also referred to as 3D NAND) device. In this case, the material into which the feature is etched may have a repeating layered structure. For instance, the material may include alternating layers of oxide (e.g., $SiO_2$) and nitride (e.g., SiN), or alternating layers of oxide (e.g., $SiO_2$) and polysilicon. The alternating layers form pairs of materials. In some cases, the number of pairs may be at least about 20, at least about 30, at least about 40, at least about 60, or at least about 70. The oxide layers may have a thickness between about 20-50 nm, for example between about 30-40 nm. The nitride or polysilicon layers may have a thickness between about 20-50 nm, for example between about 30-40 nm. The feature etched into the alternating layer may have a depth between about 2-6 μm, for example between about 3-5 μm. The feature may have a width between about 50-150 nm, for example between about 50-100 nm.

III. Etching/Deposition Processes

Figure 2A:
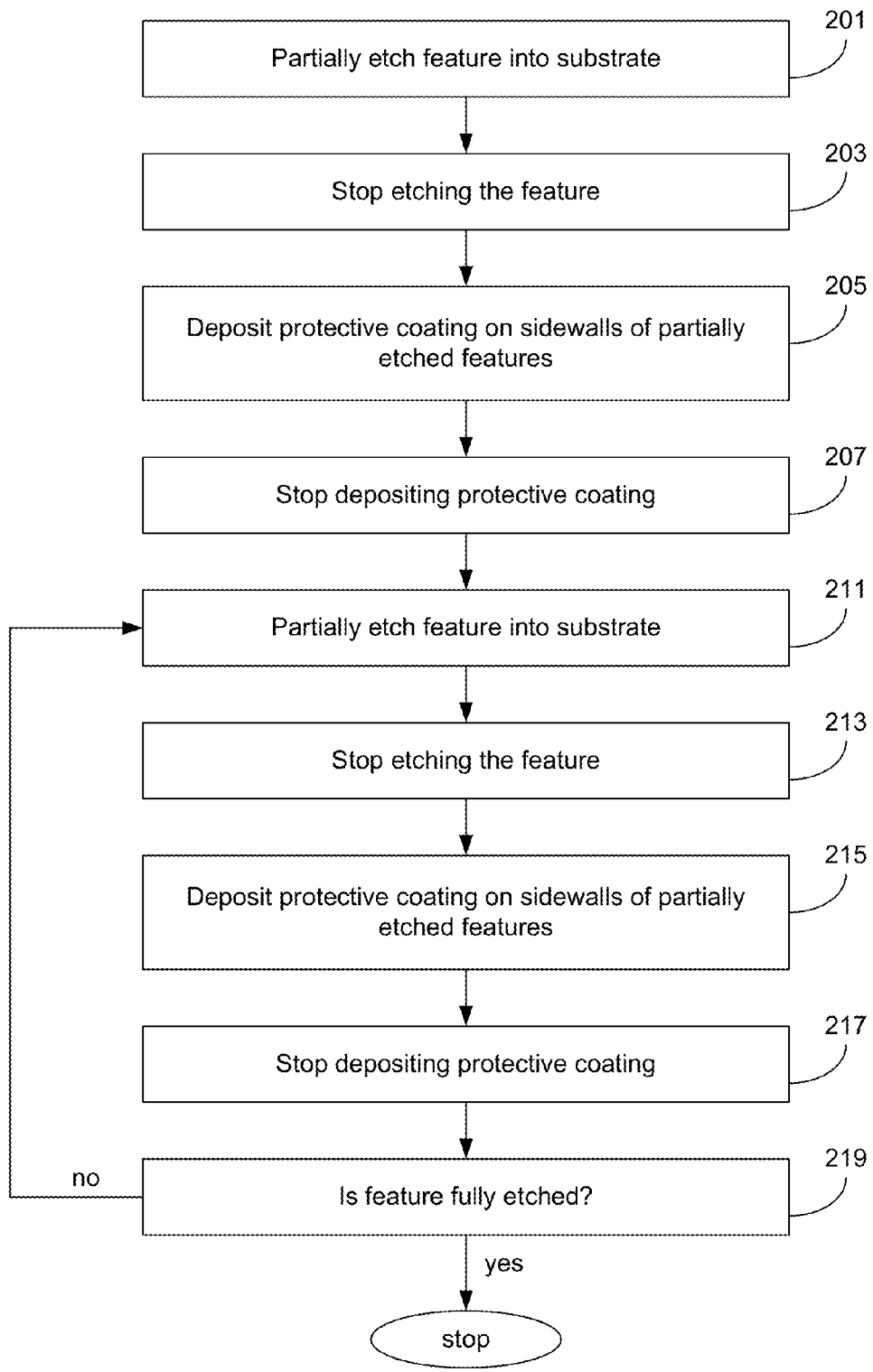
FIG. 2A presents a flowchart for a method of forming an etched feature on a semiconductor substrate according to various disclosed embodiments.

FIG. 2A presents a flowchart for a method of forming an etched feature in a semiconductor substrate. The operations shown in FIG. 2A are described in relation to FIGS. 3A-3D, which show a partially fabricated semiconductor substrate as the feature is etched. At operation 201, a feature 302 is etched to a first depth in a substrate having dielectric material 303 and a patterned mask layer 306. This first depth is only a fraction of the final desired depth of the feature. The chemistry used to etch the feature may be a fluorocarbon-based chemistry ($C_xF_y$). Other etch chemistries may be used. This etching operation 201 may result in formation of a first sidewall coating 304. The first sidewall coating 304 may be a polymeric sidewall coating, as described with relation to FIG. 1. The first sidewall coating 304 extends toward the first depth, though in many cases the first sidewall coating 304 does not actually reach the bottom of the feature 302.

In embodiments where the etchant employs a fluorocarbon, the first sidewall coating 304 may indirectly form from the $C_xF_y$ etching chemistry as certain fluorocarbon species/fragments deposit on the sidewalls of the feature (i.e., certain fluorocarbon species are precursors for the first sidewall coating 304). One reason that the first sidewall coating 304 does not reach the bottom of the feature 302 may relate to the sticking coefficient of the precursors that form the coating. In particular, it is believed that for certain etchants the sticking coefficient of these first sidewall coating precursors is too high, which causes the substantial majority of the precursor molecules to attach to the sidewalls soon after entering the feature. As such, few sidewall coating precursor molecules are able to penetrate deep into the feature where sidewall protection is beneficial. The first sidewall coating 304 therefore provides only partial protection against overetching of the sidewalls of the feature 302. In some implementations, the etch conditions provide little, if any, sidewall protection.

Next, at operation 203 the etching process is stopped. After the etching is stopped, a second sidewall coating 310 is deposited in operation 205. In some cases, coating 310 may be effectively the first sidewall coating. This deposition may occur through various reaction mechanisms including, but not limited to, chemical vapor deposition (CVD) methods and atomic layer deposition (ALD) methods (either of which may or may not be plasma-assisted). ALD methods are particularly well suited for forming conformal films that line the sidewalls of the features. For instance, ALD methods are useful for delivering reactants deep into features due to the adsorption-driven nature of such methods. While the embodiments herein are not limited to methods in which the second sidewall coating 310 is deposited through ALD, the method chosen to deposit the second sidewall coating 310 should allow for the protective layer to be formed deep in the etched feature 302. CVD and other deposition processes may be suitable in various implementations.

In certain embodiments, the second sidewall coating 310 is deposited using a reactant having a relatively low sticking coefficient (e.g., a silicon-containing reactant and/or a boron-containing reactant). The sticking coefficient should be low with respect to whatever species is present on the sidewalls at the time the reactant is delivered (e.g., the sticking coefficient may be low with respect to the native sidewalls and/or any species present on the sidewalls). Further, the relevant sticking coefficient is that of the species that actually contacts the feature sidewalls; such species may or may not be the reactant that enters the chamber.

Figure 3A:
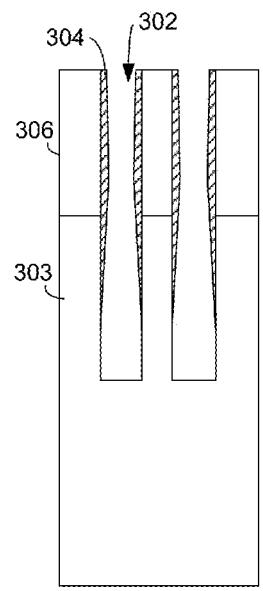
FIGS. 3A-3D depict etched cylinders in a semiconductor substrate as the cylinders are cyclically etched and coated with a protective sidewall coating according to various embodiments.
Figure 3B:
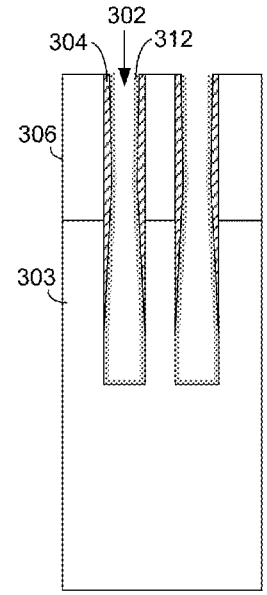
Figure 3C:
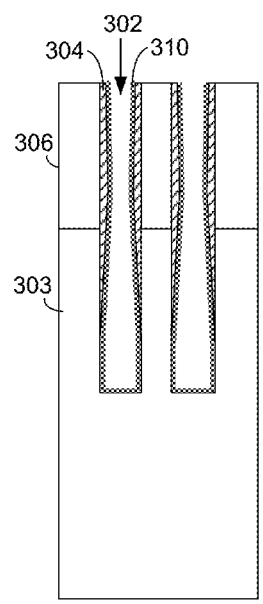

In various cases, the second sidewall coating 310 may be formed through a cyclic process resulting in a conformal film. In one embodiment where the second sidewall coating 310 is deposited through ALD methods, the deposition in operation 205 includes (a) flowing a low sticking coefficient reactant into the reaction chamber and allowing the reactant to adsorb onto the surface of the substrate, thereby forming an adsorbed precursor layer 312; (b) optionally purging the reaction chamber (e.g., by sweeping with a purge gas, evacuating the reaction chamber, or both); (c) exposing the substrate to a plasma generated from an oxygen-containing and/or nitrogen-containing reactant (often provided with hydrogen, as well) to thereby drive a surface reaction to form a layer of the second sidewall coating 310 (this second sidewall coating 310 is typically an etch resistant film); (d) optionally purging the reaction chamber; and (e) repeating (a)-(d) to form additional layers of the second sidewall coating 310. The adsorbed precursor layer 312 is shown in FIG. 3B, and the second sidewall coating 310 is shown in FIG. 3C. The precursor adsorption (FIG. 3B) and film formation (FIG. 3C) may be cycled a number of times to form a film having a desired thickness.

Figure 2B:
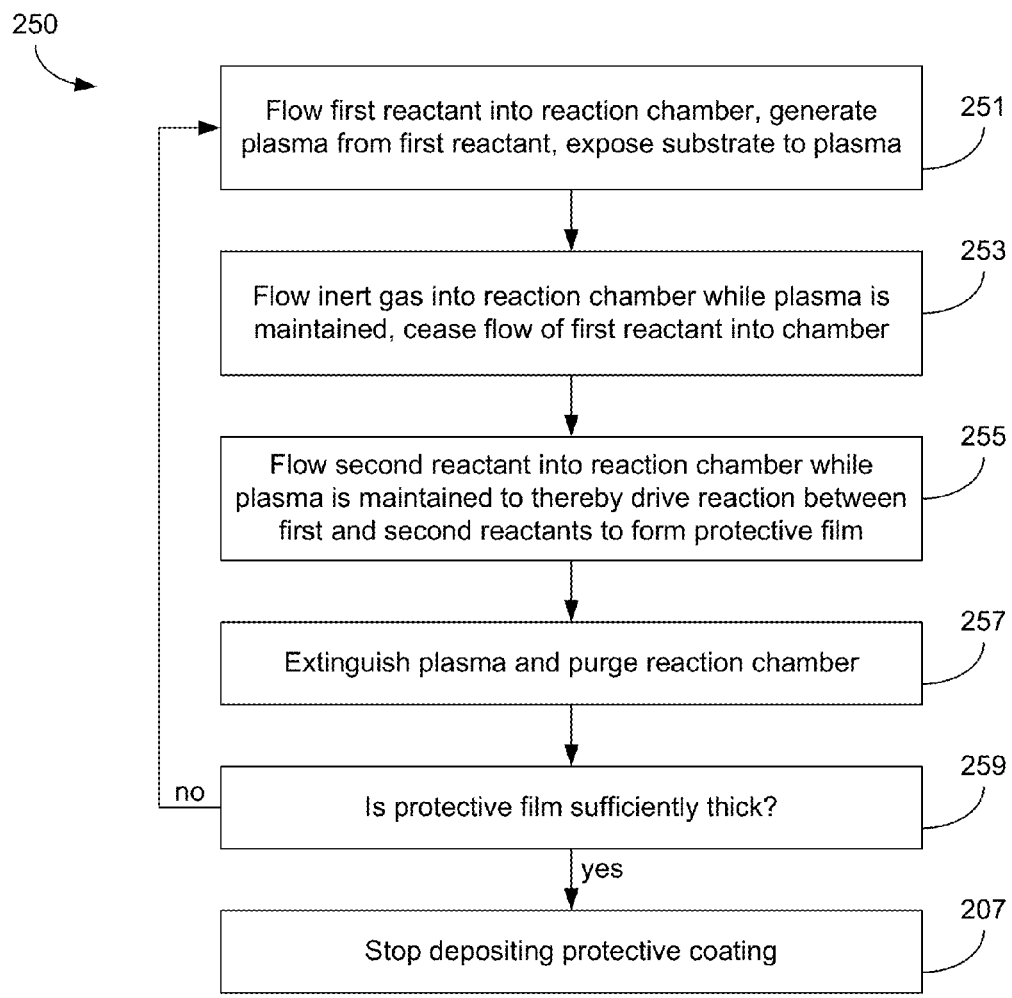
FIG. 2B presents a flow chart for a method of depositing a protective sidewall film in partially etched features where the deposition occurs according to a cyclic method.

In another embodiment, the second sidewall coating 310 may be deposited through a cyclic ALD-like process as described in relation to FIG. 2B. This deposition process may be particularly useful in embodiments where the mask layer 306 is sensitive to damage, e.g., damage arising from strong oxidation conditions (such as damage often resulting in etching of the mask layer), though this deposition process may be used in other cases, as well. Example mask materials that are sensitive to oxidation damage include materials that are primarily carbon or polymer. Particular examples of oxidation sensitive materials commonly used as mask layers include various photoresist materials, spin-on carbon, and amorphous carbon. Reaction conditions and other considerations that may be particularly relevant when processing on a substrate that includes an exposed oxidation sensitive layer are discussed further below. The mask sensitivity issue is discussed further in the context of FIG. 2C.

As shown in FIG. 2B, the deposition operation 205 may in some embodiments include operation 251, where a first reactant is flowed into the reaction chamber, plasma is generated from the first reactant, and the substrate is exposed to the plasma. This may result in the formation of a precursor layer (similar to adsorbed precursor layer 312) on the substrate. The precursor layer in this case may or may not be adsorption limited/saturation limited. For instance, the precursor layer may be under-saturated (e.g., having less than a full monolayer of precursor thereon) in some cases. In some other cases, the thickness of the precursor layer may greater than would be achieved in a fully adsorption-limited process, in some embodiments forming a precursor layer that is thicker than a monolayer of precursor.

Next, at operation 253, the flow of the first reactant may be ceased, and an inert gas may optionally be flowed into the reaction chamber. In some cases the plasma may be continuous during the transition between operations 251 and 253, such that a single plasma is used, the plasma having a composition that changes over time. In some other cases, the plasma may be extinguished between operations 251 and 253. In some such cases, the plasma may be reignited during the purge in operation 253. In some other embodiments, the purge gas may flow into the reaction chamber in operation 253 while no plasma is present. The purge results in removal of the first reactant from the reaction chamber. Next, at operation 255, a second reactant is flowed into the reaction chamber, thereby driving a reaction between the first and second reactants to form the second sidewall coating 310, referred to in FIG. 2B as the protective coating. In some embodiments, the plasma may be continuous during the transition between operations 253 and 255, the plasma having a composition that changes over time. In some other cases, the plasma may be extinguished between operations 253 and 255. As mentioned above, in some embodiments the purge in operation 253 occurs without any plasma present in the reaction chamber. Next, at operation 257, the plasma may be optionally extinguished and the reaction chamber may be optionally purged, e.g., by evacuating the chamber and/or by flowing an inert gas into the chamber to sweep out any remaining reactants and byproducts. Where a purge occurs, it may be done with or without plasma present in the reaction chamber. The plasma may be continuously maintained during operations 251-259 or operations 251-255 in some embodiments. As mentioned, one or more of the purges shown in operations 253 and 257 may be omitted in some cases. The use of purges may help minimize unwanted gas phase reactions, but such purges are not required in all cases. After the reaction chamber is optionally purged in operation 257, it is determined whether the protective coating is sufficiently thick in operation 259. This determination may be made based on the number of cycles performed and the thickness deposited per cycle. If the film is not yet sufficiently thick, the method repeats from operation 251. If the film is sufficiently thick, the method continues at operation 207 where the protective coating deposition process is stopped. The process may then continue with operation 211, as shown in FIG. 2A.

The deposition process 250 is similar to an ALD process in that reactants are delivered cyclically such that the first and second reactants are not concurrently present in the chamber in either gas phase or plasma phase. In this case a single cycle includes operations 251-259. In some embodiments, the ALD-like process described in relation to FIG. 2B may be run at conditions that result in a reaction that is less adsorption-limited than true ALD processes.

Figure 3D:
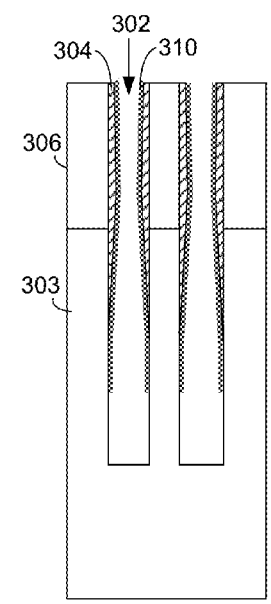

Returning to FIG. 2A, in another embodiment the second sidewall coating 310 may be deposited through CVD methods. In this case, the deposition in operation 205 may include flowing a low sticking coefficient reactant into the reaction chamber, optionally with a co-reactant (e.g., an oxygen-containing reactant and/or a nitrogen-containing reactant, optionally provided with hydrogen), while exposing the substrate to plasma. The plasma drives a gas phase reaction that results in deposition of the second sidewall coating 310. In this example, the method is represented by FIGS. 3A, 3C, and 3D (no adsorbed precursor layer 312 is formed, thus FIG. 3B is omitted).

Sticking coefficient is a term used to describe the ratio of the number of adsorbate species (e.g., atoms or molecules) that adsorb/stick to a surface compared to the total number of species that impinge upon that surface during the same period of time. The symbol Sc is sometimes used to refer to the sticking coefficient. The value of Sc is between 0 (meaning that none of the species stick) and 1 (meaning that all of the impinging species stick). Various factors affect the sticking coefficient including the type of impinging species, surface temperature, surface coverage, structural details of the surface, and the kinetic energy of the impinging species. Certain species are inherently more "sticky" than others, making them more likely to adsorb onto a surface each time the specie impinges on the surface. These more sticky species have greater sticking coefficients (all other factors being equal), and are more likely to adsorb near the entrance of a recessed feature compared to less sticky species having lower sticking coefficients. The fluorocarbon species such as those employed in conventional etch processes (and may form the first sidewall coating 304) have relatively high sticking coefficients, and therefore become concentrated near the top of the feature 302 where they first impinge upon the sidewalls. By comparison, species having lower sticking coefficients, even if they impinge upon the surface near the top of the sidewalls, are less likely to adsorb during each impact, and therefore have a greater probability of reaching the bottom portion of the feature 302.

In certain embodiments, silicon-containing reactants and boron-containing reactants are used to form the second sidewall coating 310 and have lower sticking coefficients than the fluorocarbon species that form the first sidewall coating 304. As such, these reactants are suited to forming a protective coating that reaches to the bottom of an etched feature. Further, adsorption-based ALD methods are particularly suited for forming a second sidewall coating that reaches the bottom of an etched feature because the reactant can be delivered until it substantially coats the entire sidewalls of the feature. The reactant does not build up near the top of the feature since only a monolayer of reactant typically adsorbs onto the surface during each cycle. The disclosed ALD-like method 250 of FIG. 2B is also well suited for forming a conformal film that coats the entire sidewalls of the feature.

Returning to FIG. 2A, the method continues at operation 207 where the deposition process is stopped. The method then repeats the operations of partially etching a feature in the substrate (operation 211, analogous to operation 201), stopping the etch (operation 213, analogous to operation 203), depositing protective coating on sidewalls of the partially etched features (operation 215, analogous to operation 205), and stopping the deposition (operation 217, analogous to operation 207). Next, at operation 219, it is determined whether the feature is fully etched. If the feature is not fully etched, the method repeats from operation 211 with additional etching and deposition of protective coatings. The etching operation 211 may alter the second sidewall coating 310 to form a film that is even more etch resistant than the film deposited in operations 205 and 215. In one example, the deposition operation 205 forms a layer of boron nitride (for example by alternatively cycling $BCl_3$ and $N_2+H_2$ and exposing to plasma), and the etching operation 211 reacts the boron nitride film to form boron oxide (e.g., using chemistry having a combination of fluorocarbon(s) and oxygen). In another example, the deposition operation 205 is performed through the method 250, to thereby form a layer that includes silicon and one or more of oxygen, carbon, nitrogen, hydrogen, and sulfur. Once the feature is fully etched, the method is complete.

In various embodiments, the etching operation 201 and the protective sidewall coating deposition operation 205 are cyclically repeated a number of times. For instance, these operations may each occur at least twice (as shown in FIG. 2A), for example at least about three times, or at least about 5 times. In some cases, the number of cycles (each cycle including etching operation 201 and protective sidewall coating deposition operation 205, with etching operation 211 and deposition operation 215 counting as a second cycle) is between about 2-10, for example between about 2-5. Each time the etching operation occurs, the etch depth increases. The distance etched may be uniform between cycles, or it may be non-uniform. In certain embodiments, the distance etched in each cycle decreases as additional etches are performed (i.e., later performed etching operations may etch less extensively than earlier performed etching operations). The thickness of the second sidewall coating 310 deposited in each deposition operation 205 may be uniform between cycles, or the thickness of such coatings may vary. Example thicknesses for the second sidewall coating 310 during each cycle may range between about 1-10 nm, for example between about 3-5 nm. Further, the type of coating that is formed may be uniform between the cycles, or it may vary. In one example, a boron nitride sidewall coating is formed during a first cycle of operation 205, and a boron oxide sidewall coating is formed during a second cycle of operation 205.

The etching operation 201 and the deposition operation 205 may occur in the same reaction chamber or in different reaction chambers. In one example, the etching operation 201 occurs in a first reaction chamber and the deposition operation 205 occurs in a second reaction chamber, with the first and second reaction chambers together forming a multi-chamber processing apparatus such as a cluster tool. Loadlocks and other appropriate vacuum seals may be provided for transferring the substrate between the relevant chambers in certain cases. The substrate may be transferred by a robot arm or other mechanical structure. A reaction chamber used for etching may be a Flex™ reaction chamber, for example from the 2300® Flex™ product family available from Lam Research Corporation of Fremont, Calif. A reaction chamber used for deposition may be chamber from the Vector® product family or the Altus® product family, both available from Lam Research Corporation. The use of a combined reactor for both etching and deposition may be beneficial in certain embodiments as the need to transfer the substrate is avoided. The use of different reactors for etching and deposition may be beneficial in other embodiments where it is desired that the reactors are particularly optimized for each operation. The relevant reaction chambers are discussed further below.

As noted, the deposition operation helps optimize the etching operation by forming a deeply penetrating protective layer that minimizes or prevents lateral etch of the feature during the etching operation. This promotes formation of etched features having very vertical sidewalls with little or no bowing. In certain implementations, a final etched feature having an aspect ratio of at least about 80 has a bow less than about 60% (measured as the widest critical dimension-narrowest critical dimension below that/narrowest critical dimension below that *100). For example, a feature having a maximum CD of 50 nm and a narrowest CD of 40 nm (the 40 nm CD being positioned below the 50 nm CD in the feature) has a bow of 25% (100*(50 nm-40 nm)/40 nm=25%). In another implementation, a final etched feature having an aspect ratio of at least about 40 has a bow less than about 20%.

IV. Materials and Parameters of the Process Operations

A. Substrate

The methods disclosed herein are particularly useful for etching semiconductor substrates having dielectric materials thereon. Example dielectric materials include silicon oxides, silicon nitrides, silicon carbides, oxynitrides, oxycarbides, carbo-nitrides, doped versions of these materials (e.g., doped with boron, phosphorus, etc.), and laminates from any combinations of these materials. Particular example materials include stoichiometric and non-stoichiometric formulations of $SiO_2$, SiN, SiON, SiOC, SiCN, etc. As noted above, the dielectric material that is etched may include more than one type/layer of material. In particular cases, the dielectric material may be provided in alternating layers of SiN and $SiO_2$ or alternating layers of polysilicon and $SiO_2$. Further details are provided above. The substrate may have an overlying mask layer that defines where the features are to be etched. In certain cases, the mask layer is Si, and it may have a thickness between about 500-1500 nm.

B. Etching Process

In various embodiments, the etching process is a reactive ion etch process that involves flowing a chemical etchant into a reaction chamber (often through a showerhead), generating a plasma from, inter alia, the etchant, and exposing a substrate to the plasma. The plasma dissociates the etchant compound(s) into neutral species and ion species (e.g., charged or neutral materials such as CF, $CF_2$ and $CF_3$). The plasma is a capacitively coupled plasma in many cases, though other types of plasma may be used as appropriate. Ions in the plasma are directed toward the wafer and cause the dielectric material to be etched away upon impact.

Example apparatus that may be used to perform the etching process include the 2300® FLEX™ product family of reactive ion etch reactors available from Lam Research Corporation of Fremont, Calif. This type of etch reactor is further described in the following U.S. Patents, each of which is herein incorporated by reference in its entirety: U.S. Pat. No. 8,552,334, and U.S. Pat. No. 6,841,943.

Various reactant options are available to etch the features into the dielectric material. In certain cases, the etching chemistry includes one or more fluorocarbons. In these or other cases, the etching chemistry may include other etchants such as $NF_3$. One or more co-reactants may also be provided. In some cases oxygen ($O_2$) is provided as a co-reactant. The oxygen may help moderate formation of a protective polymer sidewall coating (e.g., the first sidewall coating 304 of FIGS. 3A-3D).

In certain implementations, the etching chemistry includes a combination of fluorocarbons and oxygen. For instance, in one example the etching chemistry includes $C_4F_6$, $C_4F_8$, $N_2$, CO, $CF_4$, and $O_2$. Other conventional etching chemistries may also be used, as may non-conventional chemistries. The fluorocarbons may flow at a rate between about 0-500 sccm, for example between about 10-200 sccm. Where $C_4F_6$ and $C_4F_8$ are used, the flow of $C_4F_6$ may range between about 10-200 sccm and the flow of $C_4F_8$ may range between about 10-200 sccm. The flow of oxygen may range between about 0-500 sccm, for example between about 10-200 sccm. The flow of nitrogen may range between about 0-500 sccm, for example between about 10-200 sccm. The flow of tetrafluoromethane may range between about 0-500 sccm, for example between about 10-200 sccm. The flow of carbon monoxide may range between about 0-500 sccm, for example between about 10-200 sccm. These rates are appropriate in a reactor volume of approximately 50 liters that is used to process a single 300 mm wafer. The flow rates herein may be scaled as appropriate for reactors of different sizes, and may be scaled linearly based on substrate area for substrates of other sizes.

In some embodiments, the substrate temperature during etching is between about 0-100° C. In some embodiments, the pressure during etching is between about 10-50 mTorr. The ion energy may be relatively high, for example between about 1-10 kV. The ion energy is determined by the applied RF power. In various cases, dual-frequency RF power is used to generate the plasma. Thus, the RF power may include a first frequency component (e.g., about 2 MHz) and a second frequency component (e.g., about 60 MHz). Different powers may be provided at each frequency component. For instance, the first frequency component (e.g., about 2 MHz) may be provided at a power between about 3-6 kW, for example about 5 kW, and the second frequency component (e.g., about 60 MHz) may be provided at a lower power, for example between about 0.5-2 kW, for example about 1 kW. These power levels assume that the RF power is delivered to a single 300 mm wafer. The power levels can be scaled linearly based on substrate area for additional substrates and/or substrates of other sizes (thereby maintaining a uniform power density delivered to the substrate).

Each cycle of the etching process etches the dielectric material to some degree. The distance etched during each cycle may be between about 10-500 nm, for example between about 50-200 nm. The total etch depth will depend on the particular application. For some cases (e.g., DRAM) the total etch depth may be between about 1.5-2 µm. For other cases (e.g., VNAND) the total etch depth may be at least about 3 µm, for example at least about 4 µm. In these or other cases, the total etch depth may be about 5 µm or less.

As explained in the discussion of FIGS. 3A-3D, the etching process can produce a first sidewall coating (e.g., first sidewall coating 304, which may be polymeric). However, the depth of this sidewall coating may limited to the area near the upper portion of the feature, and may not extend all the way down into the feature where the sidewall protection is also needed. Thus, a separate deposition operation is performed, as described herein, to form a sidewall coating that covers substantially the entire depth of the etched feature.

In some processes, the operation of depositing the protective sidewall coating (e.g., the second sidewall coating 310 in FIGS. 3C and 3D) results in the deposition of a first type of film, and the etching operation alters this first type of film to form a second type of film. The second type of film may be more etch resistant than the first type of film. For instance, the deposition operation may involve formation of a boron nitride (BN) film, which is then processed into a boron oxide (BO) film during the etch operation. The inclusion of oxygen in the etch chemistry may at least partially drive this change. The boron oxide film may be particularly resistant to etching, thereby providing very good protection against over-etching the sidewalls.

C. Deposition Process

The deposition process is performed primarily to deposit a protective layer on the sidewalls within the etched features. This protective layer should extend deep into the feature, even in high aspect ratio features. Formation of the protective layer deep within high aspect ratio features may be enabled by reactants that have relatively low sticking coefficients. Further, reaction mechanisms that rely on adsorption-limited deposition (e.g., ALD reactions) can promote formation of the protective layer deep within the etched features. Deposition of the protective layer begins after the feature is partially etched. As noted in the discussion of FIG. 2A, the deposition operation may be cycled with the etching operation to form additional sidewall protection as the feature is etched deeper into the dielectric material. In some cases, deposition of the protective layer begins at or after the feature is etched to at least about ⅓ of its final depth. In some embodiments, deposition of the protective layer begins once the feature reaches an aspect ratio of at least about 2, at least about 5, at least about 10, at least about 15, at least about 20, or at least about 30. In these or other cases, the deposition may begin before the feature reaches an aspect ratio of about 4, about 10, about 15, about 20, about 30, about 40, or about 50. In some embodiments, deposition begins after the feature is at least about 1 µm deep, or at least about 1.5 µm deep (e.g., in VNAND embodiments where the final feature depth is 3-4 µm). In other embodiments, deposition begins after the feature is at least about 600 nm deep, or at least about 800 nm deep (e.g., in DRAM embodiments where the final feature depth is 1.5-2 µm deep). The optimal time for initiating deposition of the protective layer is immediately before the sidewalls would otherwise become overetched to form a bow. The exact timing of this occurrence depends on the shape of the feature being etched, the material being etched, the chemistry used to etch and to deposit the protective layer, and the process conditions used to etch and deposit the relevant materials.

The protective layer that forms during the deposition process may have various compositions. As explained, the protective layer should penetrate deep into an etched feature, and should be relatively resistant to the etching chemistry used to etch the feature. In some cases the protective layer is a ceramic material or an organic polymer. Example inorganic materials may include, but are not limited to, boron-containing materials such as stoichiometric or non-stoichiometric formulations of boron oxides ($B_xO_y$) and boron nitrides ($B_xN_y$). Other examples include stoichiometric or non-stoichiometric formulations of silicon-containing materials such as silicon oxides ($Si_xO_y$), silicon nitrides ($Si_xN_y$), silicon carbides ($Si_xC_y$), and amorphous silicon (Si). The material of the protective layer may also include certain additional elements. In some cases, the protective layer includes two or more of silicon, oxygen, nitrogen, carbon, hydrogen, and sulfur. In some cases, the protective layer includes three or more of such elements. Example organic materials may include polyolefins, for example polyfluoroolefins in some cases. One particular example is a polytetrafluoroethylene. A precursor fragment used for forming some polyfluoroolefins is $CF_2$ (which may come from hexafluoropropylene oxide (HFPO) in certain cases), which has a very low sticking coefficient and is therefore good at penetrating deep into an etched feature. Other examples may include stoichiometric and non-stoichiometric formulations of boron carbides. In further embodiments, the protective layer that forms during the deposition process may be a metal oxide, metal nitride, or metal carbide.

Where the protective layer includes boron, a boron-containing reactant may be used. Example boron-containing reactants include, but are not limited to, triisopropyl borate ($[(CH_3)_2CHO]_3B$), trimethylboron-$d_9$ ($B(CD_3)_3$), triphenylborane (($C_6H_5)_3B$), and tris(pentafluorophenyl)borane (($C_6F_5)_3B$). Other examples of boron-containing reactants include boron trichloride ($BCl_3$), borane ($BH_3$), diborane ($B_2H_6$), boron trifluoride ($BF_3$), and trimethyl borate ($B(OCH_3)_3$). In a particular example, a boron-containing reactant is selected from the group consisting of: $B_2H_6$, $BCl_3$, $BF_3$, and combinations thereof. Cyclic ALD or ALD-like deposition reactions may deposit the boron-containing protective layer. Alternatively, non-cyclic processes such as bulk CVD deposition may deposit the boron-containing protective layer.

Where the protective layer includes silicon, a silicon-containing reactant may be used. A silicon-containing reactant may be, for example, a silane, a halosilane or an aminosilane. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane (Cl-$SiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. One specific bromosilane is $SiBr_4$. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)_3$). In a particular example, a silicon-containing reactant is selected from the group consisting of $SiCl_4$, $SiH_4$, $SiF_4$, $SiBr_4$, and combinations thereof. Cyclic ALD or ALD-like deposition reactions may deposit the silicon-containing protective layer. Alternatively, non-cyclic processes such as bulk CVD deposition may deposit the silicon-containing protective layer. In certain embodiments, the silicon containing precursor is reacted with an oxidant such nitrous oxide and/or molecular oxygen to produce a silicon oxide protective coating. In some other cases, the silicon containing precursor may be reacted with a relatively weak oxidant as described further herein.

Where the protective film includes nitrogen—e.g., a silicon nitride, a silicon oxynitride, or a boron nitride—a nitrogen-containing reactant may be used. A nitrogen-containing reactant contains at least one nitrogen, for example, nitrogen, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants. Another example is nitrous oxide.

Where the protective film includes oxygen—e.g., a silicon oxide, a boron oxide, or a metal oxide—an oxygen-containing reactant may be used. Examples of oxygen-containing reactants include, but are not limited to, oxygen, ozone, nitrous oxide, nitric oxide, nitrogen dioxide, carbon monoxide, carbon dioxide, sulfur oxide, sulfur dioxide, oxygen-containing hydrocarbons ($C_xH_yO_z$), water, mixtures thereof, etc. The disclosed precursors are not intended to be limiting. As noted herein, in certain implementations such as those where the substrate includes an exposed layer that is sensitive to oxidation (e.g., amorphous carbon), a relatively gentle oxygen-containing reactant may be selected to minimize the degree of oxidation-related damage. In some such cases, the oxygen-containing reactant may be selected from the group consisting of carbonyl sulfide (COS), carbon monoxide (CO), sulfur dioxide ($SO_2$), carbon dioxide ($CO_2$), $N_xO_y$, (e.g., nitric oxide (NO), nitrous oxide ($N_2O$), nitrogen dioxide ($NO_2$), dinitrogen trioxide ($N_2O_3$), dinitrogen tetroxide ($N_2O_4$), and/or dinitrogen pentoxide ($N_2O_5$)), water ($H_2O$), formaldehyde ($H_2CO$), and combinations thereof.

A number of different carbon-containing reactants may be used, particularly where the protective film includes carbon. Examples of carbon-containing reactants include, but are not limited to, COS, $CS_2$, $CH_4$, $C_2H_4$, $C_2H_6$, other hydrocarbons, and other carbon-containing reactants listed herein. The carbon-containing reactants listed in this section are expected to be particularly well suited for embodiments where the substrate includes an exposed oxidation sensitive layer (e.g., an exposed carbon mask layer). The films produced using such reactants may also include hydrogen in various cases.

Various sulfur-containing reactants may be used, particularly where the protective film includes sulfur. Example sulfur-containing reactants include COS, SO, $SO_2$, $CS_2$, $H_2S$, sulfur-containing hydrocarbons, and combinations thereof.

When the protective coating contains an organic polymer, a low sticking coefficient precursor is used. Examples of such precursors include those that produce $CF_2$ fragments.

Other reactants may also be used as known by those of ordinary skill in the art. For example where the protective film includes a metal, a metal-containing reactant may be used, and where the protective film includes carbon, a carbon-containing reactant may be used.

A few particular examples of reactant combinations will be provided, though these examples are not intended to be limiting. In one example, a boron-containing precursor film is formed by adsorbing a boron-containing reactant such as $B_2H_6$, $BCl_3$ or $BF_3$ to the substrate surface. The precursor film is converted to a protective film through exposure to an oxidizing or nitridizing plasma (e.g., the plasma being generated from $O_2$, $N_2$, $NH_3$, $N_2O$, $H_2$, and combinations thereof).

In a particular example, $BCl_3$ is adsorbed to form the boron-containing precursor layer, and then a plasma is generated from a combination of $N_2$ and $H_2$, which drives formation of a boron nitride protective film. The reaction may occur through a cyclic process such as ALD. In a similar example, the reaction may occur through a continuous process such as CVD, where the $BCl_3$, $N_2$ and $H_2$ are all provided concurrently while the substrate is exposed to plasma. After formation of the boron nitride film, the substrate may be further etched. The etching chemistry may include oxygen (along with other etching chemistry, e.g., fluorocarbons such as $C_4F_6$ and/or $C_4F_8$), which can react with the boron nitride film to form boron oxide. The boron oxide is particularly resistant to the fluorocarbon-based etch chemistry, thereby providing good protection against overetching the sidewalls.

In another example, a silicon containing species (e.g., $SiCl_4$, $SiH_4$, $SiF_4$, $SiBr_4$, etc.) is adsorbed onto the surface of the substrate to form a silicon-containing precursor film. The silicon-containing precursor film may be converted to silicon oxide or silicon nitride by exposing it to a plasma generated from $O_2$, $N_2$, $NH_3$, $N_2O$, $H_2$, and combinations thereof. If the dielectric material being etched includes silicon oxide, it may be preferable to form the protective layer as a silicon nitride (and vice versa).

In another example, a silicon containing species may be used in combination with a co-reactant that does not result in substantial damage to a sensitive mask layer. Particular reactants that are useful in this context are discussed further below in the section related to Deposition on Sensitive Substrates. In various embodiments, such reactants provide little or any oxygen radicals during deposition.

As noted above, the precursor(s) and fragments thereof used to form the protective layer may have relatively low sticking coefficients, thereby enabling the precursors to penetrate deep into the etched features. In some cases, the sticking coefficient of the precursors (at the relevant deposition conditions) may be about 0.05 or less, for example about 0.001 or less. Similarly, the precursor(s) and fragments thereof used to form the protective layer may have a relatively low recombination rate. Species having low recombination rates are better able to penetrate deep into a feature while remaining reactive. The loss coefficient addresses the loss of reactant species due to both recombination and absorption on surfaces. In a number of embodiments, the loss coefficient is relatively low, such that reactant species are able to survive and penetrate deep into high aspect ratio features while remaining reactive. This allows the protective coating to be deposited along a substantial fraction of the length/depth of the partially etched feature. In certain cases the coating may be deposited along the entire length of the feature. In various cases, the loss coefficient may be less than about 0.005.

The reaction mechanism may be cyclic (e.g., ALD or ALD-like processes) or continuous (e.g., CVD). Any method that results in the formation of the protective sidewall film at high aspect ratios may be used. As mentioned, cyclic ALD and ALD-like reactions may be particularly well suited for this purpose due to their conformality and adsorption-limited properties. However, other types of reactions may be used so long as the film is able to form at high aspect ratios to protect the sidewalls deep in an etched feature. The basic operations for ALD, ALD-like, and CVD reactions are described above in relation to operation 205 of FIG. 2A and in relation to method 250 of FIG. 2B.

Briefly, plasma assisted ALD reactions may involve cyclically performing the following operations: (a) delivery of a first reactant to form an adsorbed precursor layer, (b) an optional purge operation to remove the first reactant from the reaction chamber, (c) delivery of a second reactant, often provided in the form of a plasma or in the presence of a plasma, (d) optional purge to remove excess reactant, and (e) repeating (a)-(d) until the film reaches a desired thickness. Similarly, various ALD-like reactions may involve cyclically performing the operations of: (a) flowing a first reactant, generating a plasma from the first reactant, and exposing the substrate to the plasma (b) flowing an inert gas while maintaining the plasma, ceasing the flow of the first reactant, and thereby sweeping the first reactant from the reaction chamber, (c) flowing a second reactant while maintaining the plasma, thereby driving a reaction between the first and second reactants, (d) extinguishing the plasma and purging the reaction chamber, and (e) repeating (a)-(d) until the film reaches a desired thickness. In some cases an ALD process may omit one or more of the purge operations in (b) and/or (d).

Because the reactants are provided at separate times and the reaction is a surface reaction, the film may be adsorption limited to some degree. This results in the formation of conformal films that can line entire recessed features. By contrast, plasma assisted CVD reactions involve delivering reactant(s) to the substrate continuously while the substrate is exposed to plasma. CVD reactions are gas phase reactions, which deposit reaction products on the substrate surface.

The following reaction conditions may be used in certain embodiments where the deposition reaction occurs through ALD methods, and/or in some embodiments where the deposition reaction occurs through ALD-like methods. The substrate temperature may be maintained between about 0-500° C., for example between about 20-200° C. The pressure may be maintained as low as about 100 or 200 mTorr and as high as about 1, 2, or 3 Torr. The ion energy may be relatively low, for example below about 1 kV. The RF frequency used to generate the plasma may be about 60 MHz, though other frequencies may also be used. The RF power may be a few hundred Watts, for example about 500 W or less (e.g., about 7100 W/m$^2$ or less), about 400 W or less (e.g., about 7100 W/m$^2$ or less), or about 300 W or less (e.g., about 7100 W/m$^2$ or less). Power levels herein are reported assuming the power is delivered to a single 300 mm wafer, the power scaling linearly based on substrate area for additional or differently sized substrates. During each ALD cycle, the adsorbing reactant may be delivered for a duration between about 0.5-20 seconds, at a flow rate between about 50-1000 sccm. The first purge may have a duration between about 0-60 seconds. The plasma may be exposed to the substrate for a duration between about 0.5-120 seconds, with a flow rate of a reactant (excluding any inert gas provided along with the reactant) between about 50-1000 sccm. A flow rate of hydrogen during the plasma exposure may be between about 0-1000 sccm. The post-RF purge may have a duration between about 0-60 seconds.

The following reaction conditions may be used in certain embodiments where the deposition reaction occurs through CVD methods. The substrate temperature may be maintained between about 0-500° C., for example between about 20-200° C. The pressure may be maintained between about 100-3000 mT. The RF frequency used to generate the plasma may be 2-60 MHz. The RF power used to generate the plasma may be between about 50-2000 W (e.g. between about 700-28,000 W/m$^2$), for example between about 100-800 W (e.g., between about 1,400-11,300 W/m$^2$)). The duration of the reactant delivery and plasma exposure may be between about 1-180 seconds. The flow rates depend on the particular reactants. In one example, BCl$_3$, N$_2$ and H$_2$ are provided, with BCl$_3$ provided at a flow rate between about 50-1000 sccm, N$_2$ at a rate between about 50-1000 sccm, and H$_2$ at a rate between about 50-1000 sccm.

The following reaction conditions may be used in certain embodiments where the deposition reaction occurs through an ALD-like method such as the method 250 shown in FIG. 2B. These conditions may be particularly well suited for embodiments where the reaction employs silicon tetrachloride as the precursor/first reactant and carbonyl sulfide (COS) as the oxidant/second reactant. The substrate temperature may be maintained between about 20-200° C., for example between about 40-80° C. The pressure may be maintained between about 5-200 mTorr, for example between about 10-50 mTorr. The first reactant may be provided in operation 251 at a rate between about 5-100 sccm, or between about 20-60 sccm, not counting any carrier gas. A carrier gas provided in operation 251 may be provided at a rate between about 40-400 sccm. A plasma may be generated from the first reactant and carrier gas. The plasma may be generated in operation 251 using both low frequency (LF) and high frequency (HF) RF frequencies. In certain cases, the LF frequency may be provided at a power level between about 0-300 W (e.g., between about 0-4,250 W/m$^2$), or between about 100-250 W (e.g., between about 1,400-4,250 W/m$^2$). As used elsewhere herein, power levels are reported assuming that a single 300 mm substrate is being processed, and the power levels can be scaled linearly based on substrate area. In these or other cases, the HF frequency may be provided at a power level between about 0-300 W (e.g., between about 0-4,250 W/m$^2$), or between about 50-200 W (e.g., between about 700-2,800 W/m$^2$). The duration over which the first reactant flows in operation 251 in each cycle may be between about 2-15 seconds. The purge gas provided in operation 253 may flow at a rate between about 40-400 sccm, for a duration between about 5-30 seconds during each cycle. As noted, this purge may be omitted in some cases. The plasma may be generated or maintained in operation 253 using HF RF frequency and optionally using LF RF frequency. In some cases the plasma may be generated or maintained in operation 253 using only HF RF frequency. In various embodiments, the HF RF frequency may be provided during operation 253 at a power level between about 0-600 W (e.g., between about 0-8,500 W/m$^2$), for example between about 100-300 W (e.g., between about 1,400-4,250 W/m$^2$). The LF RF frequency, if used during operation 253, may be provided at a power level between about 0-150 W (e.g., between about 0-2,150 W/m$^2$), or between about 20-70 W (e.g., between about 280-1,000 W/m$^2$). Next, at operation 255, the second reactant may be provided at a rate between about 10-100 sccm, for example between about 20-50 sccm, not counting any carrier gas. A carrier gas may be provided at a rate between about 40-100 sccm. The second reactant may be provided over a period having a duration between about 5-30 seconds, for example between about 7-20 seconds. The plasma may be generated or maintained during operation 255 using HF RF frequency, and optionally using LF RF frequency. The HF RF may be provided at a power level between about 50-500 W (e.g., between about 700-7,100 W/m$^2$), for example between about 200-300 W (e.g., between about 2,800-4,250 W/m$^2$) during operation 255. The LF RF power, if provided, may be provided at a power level between about 0-200 W (0-2,800 W/m$^2$), for example between about 0-100 W (0-1,400 W/m$^2$), or between about 10-40 W (140-560 W/m$^2$) in certain cases. In certain cases the LF RF power provided during operation 255 may be less than about 200 W (e.g., less than about 2,800 W/m$^2$), less than about 100 W (e.g., less than about 1,400 W/m$^2$, or less than about 40 W (e.g., less than about 560 W/m$^2$). As noted herein, in various embodiments the plasma is maintained using only HF RF frequencies during at least operation 255 and optionally during operation 253. The plasma may or may not be continuously maintained during operations 215, 253 and 255. In some cases, the method 250 may be repeated until the protective layer reaches a thickness between about 1-10 nm, for example between about 3-5 nm.

In certain embodiments, the plasma may be a capacitively coupled plasma. In some other embodiments, the plasma may be an inductively coupled plasma, a remotely generated plasma, a microwave plasma, etc. In some implementations, the plasma is a capacitively coupled plasma generated at one or more frequencies as mentioned above. The frequency or frequencies used to generate the plasma may include low frequency (LF) components and/or high frequency (HF) components. In some cases only HF frequencies are used during particular processing steps as described herein.

The ALD, ALD-like, and CVD reaction conditions are provided as guidance and are not intended to be limiting.

In some embodiments the method 250 or another deposition method may be performed in the context of a substrate that has an exposed oxidation sensitive layer. In some such cases, the reaction parameters may be further limited as described below to avoid oxidizing or etching an oxidation sensitive mask layer (or other oxidation sensitive layer). In particular some layers, such as carbon-based masks, are prone to oxidation reactions that lead to etching of the layer due to formation of volatile products. Removal of the mask in the vertical and/or horizontal directions is an undesirable potential side-effect of the deposition step.

D. Deposition on Sensitive Substrates

In certain embodiments, the protective layer (e.g., the second sidewall coating 310 in FIGS. 3C and 3D) may be deposited through a process designed to avoid harsh oxidation conditions. This deposition process may be particularly useful in embodiments where the mask layer 306 is sensitive to damage, e.g., damage arising from strong oxidation conditions. As noted above, oxidation reactions can lead to etching/damaging the mask layer. Example mask materials that are sensitive to oxidation damage include materials that are primarily carbon or polymer. Particular examples of oxidation sensitive materials commonly used as mask layers include various photoresist materials, spin-on carbon, and amorphous carbon. These mask materials are commonly used for certain applications such as forming non-volatile RAM structures.

Figure 2C:
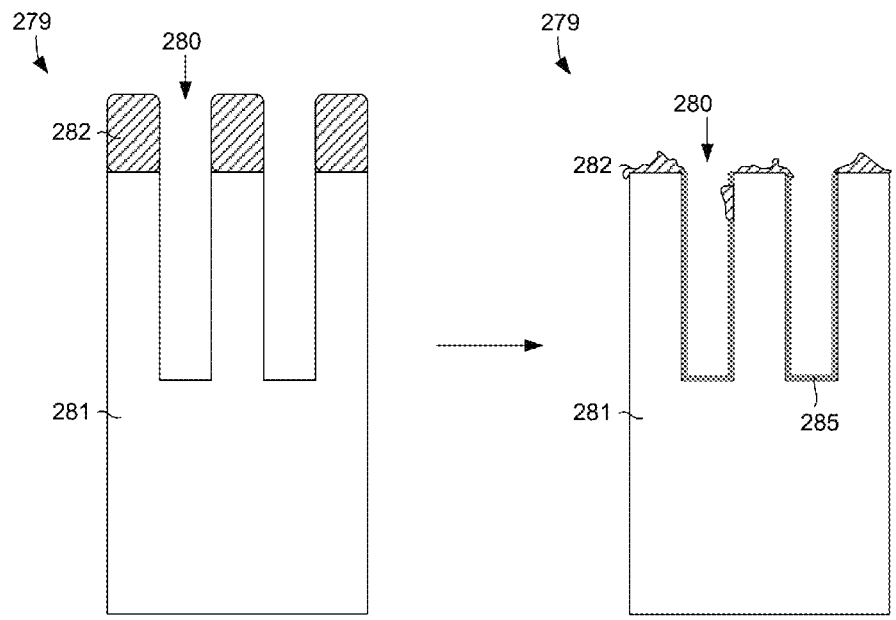
FIG. 2C illustrates partially etched features having an oxidation sensitive mask layer thereon, both before and after exposure to an O$_2$ plasma.

FIG. 2C presents cross-sectional views of a partially fabricated semiconductor device 279 having cylinders 280 etched into a stack of materials 281. The stack 281 may include alternating layers of material as described herein. A patterned mask layer 282 overlays the stack 281. In this example, the patterned mask layer 282 is made of amorphous carbon. The left portion of FIG. 2C shows the partially fabricated semiconductor device 279 after an initial etching operation is performed, but before the protective sidewall film 285 is deposited. The device may also include a coating on the sidewall (not shown) that results from the etching process (similar to first sidewall coating 304 of FIGS. 3A-3D). The right portion of FIG. 2C shows the partially fabricated semiconductor device 279 after a deposition reaction involving exposure to O$_2$ plasma to deposit the protective sidewall film 285. Because the mask layer 282 is amorphous carbon, exposure to the O$_2$ plasma severely degrades/etches the mask layer 282. The degradation may be more severe in cases where the substrate is strongly biased using LF RF frequencies.

In some cases, the mask layer 282 may be completely removed during a deposition process involving exposure to O$_2$ plasma (or another strong oxidant). The resulting device would not be able to undergo an additional etching operation (to etch the cylinders 280 deeper) since there is insufficient mask to protect the stack 281 between the cylinders 280. The mask material may also be sputtered into the cylinders 280, as shown in the right portion of FIG. 2C. In some cases where sputtering into cylinders is substantial, it may cause the cylinders to become blocked, thereby preventing completion of the etch of the cylinders. This blockage is unacceptable, even if it only occurs in a very small percentage of the cylinders (e.g., one incompletely etched cylinder per million is not acceptable in many cases).

Figure 2D:
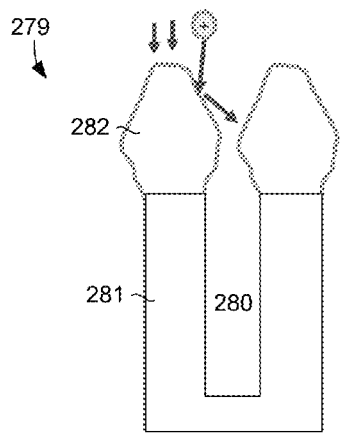
FIG. 2D shows a view of a partially etched feature where the mask becomes faceted during deposition of a protective layer.

Faceting may also be a problem in certain cases. As shown in FIG. 2D, a patterned mask layer 282 over a stack 281 on the partially fabricated semiconductor device 279 can become faceted when processed under particular conditions. Such conditions may relate to the use of an oxidation sensitive mask layer 282 in combination with a relatively strong LF RF bias on the substrate. Ion bombardment under such conditions can lead to sputtering of the mask layer 282. The sputtered mask material can redeposit on the substrate as shown in FIG. 2D.

The use of oxidation sensitive mask materials may limit the options for certain reaction parameters. For instance, oxidation sensitive mask materials may limit the choice of reactants. Oxygen (O$_2$) can be detrimental to use as a reactant where oxidation sensitive materials such as carbon are used. Oxygen radicals, which are produced when O$_2$ (and/or certain other oxygen-containing reactants) is exposed to plasma, are extremely reactive with respect to the carbon mask. The oxygen radicals can damage and even destroy a carbon mask under various conditions, as shown in FIG. 2C. The damage may result from oxidation reactions between the mask and strong oxidants (e.g., oxygen radicals) present in the chamber, which result in the mask layer being etched away both vertically and horizontally. This damage/etching may leave the mask incapable of performing its intended function (protecting areas that should not be etched while exposing areas that should be etched). This damage can be compared with a less serious mask erosion issue. Where the mask is merely eroded, the erosion occurs at a relatively uniform rate from the top of the mask downwards. The pattern in the mask is maintained. Erosion of the mask should generally be minimized, but some degree of erosion can be accommodated by choosing an appropriate mask thickness. By contrast, where the mask is damaged or destroyed, the damage may occur both vertically from the top down and laterally from the sides, and the pattern in the mask is essentially ruined due to enlargement of the holes beyond the targeted CD and/or by distortion of the mask layer.

The deposition reaction may occur through any of the methods disclosed herein, for example ALD methods, ALD-like methods, and CVD methods. In some embodiments, the deposition reaction occurs according to method 250 of FIG. 2B. Other methods may also be used.

In certain embodiments, the first reactant may be a silicon-containing reactant. The first reactant may be one with properties such that its flow can be controlled in the gaseous state, with delivery of the reactant from a storage container to the processing system (e.g., to a mass flow controller) in the gaseous (rather than liquid) state. In a particular embodiment the first reactant may be silicon tetrachloride ($SiCl_4$), though other reactants may also be used, as listed above.

In some embodiments, the second reactant may be an oxidizing reactant or a nitriding reactant. In various implementations, the second reactant may include one or more elements from the group consisting of oxygen, nitrogen, carbon, and sulfur. In a number of cases, the second reactant is a sulfur-containing reactant. In some such embodiments the second reactant may be one that produces SO. radicals when exposed to plasma. SO. radicals may be particularly effective at combining with halogens (e.g., chlorine, etc.) remove the halogens from the growing film. The second reactant may exclude $O_2$ and other strong oxidants in some cases, particularly where oxygen radicals would be detrimental to a material on the substrate (e.g., an exposed carbon mask). Examples of other strong oxidants that may be avoided in certain cases where an oxidation sensitive mask layer is used include ozone and $H_2O$. In similar cases, the second reactant may substantially exclude or limit the fraction of $O_2$ and other strong oxidants provided during delivery of the second reactant. For instance, such reactants may be present only at incidental/negligible amounts. In another example, the second reactant may be provided with a small fraction of $O_2$ (or other strong oxidant), where the amount of $O_2$ (or other strong oxidant) is tailored to avoid damaging the mask beyond an acceptable degree.

In some embodiments the second reactant may be selected from the group consisting of carbonyl sulfide (COS), carbon monoxide (CO), sulfur dioxide ($SO_2$), carbon dioxide ($CO_2$), carbon disulfide ($CS_2$), $N_xO_y$ (e.g., nitric oxide (NO), nitrous oxide ($N_2O$), nitrogen dioxide ($NO_2$), dinitrogen trioxide ($N_2O_3$), dinitrogen tetroxide ($N_2O_4$) and/or dinitrogen pentoxide ($N_2O_5$)), water ($H_2O$), formaldehyde ($H_2CO$), and combinations thereof. Either or both of the first and second reactants may be provided in a diluent gas (e.g., argon, helium, neon, krypton, xenon, nitrogen, hydrogen, combinations thereof, etc.).

Some embodiments employ carbonyl sulfide as an oxidant in a cyclic process. It may be used with any precursor such as the silicon and metal-containing precursors described herein. In some cases, the precursor is a halosilane such as a chlorosilane. In one example, the protective layer is deposited using a silicon tetrahalide (e.g., silicon tetrachloride) as the precursor and carbonyl sulfide as the oxidant.

In certain embodiments where an oxidation sensitive mask is used, the reactants and processing conditions may be chosen such that the concentration of oxygen radicals (O.) remains below a certain density. In order to limit the density of oxygen radicals, the second reactant during deposition of the protective film may be controlled such that no more than a limited fraction of the second reactant is $O_2$. In some implementations, the second reactant may be a gas mixture which includes no more than about 30% $O_2$ (measured in terms of volumetric flow), for example no more than about 25%, no more than about 20%, no more than about 10%, no more than about 5%, or no more than about 1%. In some other cases, these same limits may apply, but with respect to the fraction of $O_2$ in the second reactant, excluding any inert gas provided with the second reactant (e.g., a second reactant may be up to about 30% $O_2$, with the remaining 70% being COS, and provided with any amount of inert gas). Such limits may also apply to the other strong oxidants mentioned herein. If more than one such strong oxidant is provided, these limits may apply cumulatively to all of the strong oxidants.

In various implementations, the film formed is a silicon-containing film such as $SiO_x$, $SiN_x$, $SiC_x$, or amorphous silicon. Certain other elements may be present in the film, for example sulfur.

Another reaction parameter that may be limited where an oxidation sensitive mask is used is the bias applied to the substrate during deposition, particularly during exposure to an oxygen-containing plasma. Such limits may relate to the frequency of the bias and/or the power at which it is provided. The bias refers to the difference in potential between the substrate and the plasma, and it controls the energy of ions that bombard the substrate. As explained further below, the plasma may be generated by applying RF power at one or more frequencies. In various embodiments, sensitive mask materials may be better preserved where the low frequency (LF) component of the RF power is either non-existent (0 W) or relatively low (e.g., less than about 200 W (less than about 2,800 $W/m^2$), or less than about 100 W (less than about 1,400 $W/m^2$) of LF RF power per 300 mm substrate). Such limits on the LF RF power may be particularly relevant when the substrate is exposed to oxidizing conditions (e.g., during operation 255 of FIG. 2B), though such limits may also be practiced during other times (e.g., during operations 251 and/or 253 of FIG. 2B). Under various conditions disclosed herein, the protective film may coat the mask layer, thereby protecting the mask layer and helping to preserve it. The use of LF bias, particularly at high power levels when the substrate is exposed to an oxygen-containing plasma, may prevent the protective layer from forming on the mask material and increase the risk of degrading the mask.

Figure 2E:
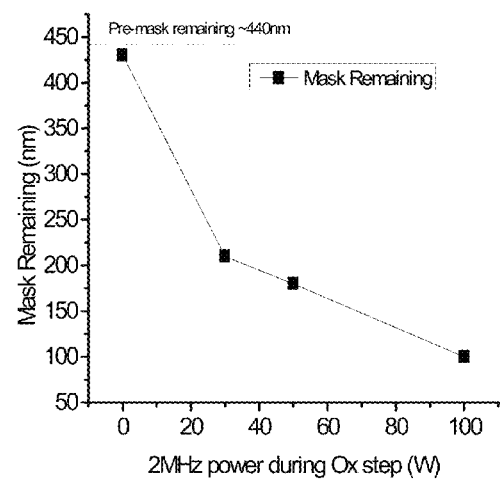
FIG. 2E is a graph showing the mask remaining vs. the amount of low frequency (LF) RF power used during an oxidation step during deposition of a protective sidewall film according to certain implementations.

FIG. 2E presents a graph showing that greater amounts (Watts) of LF RF power during a deposition process (when the substrate is exposed to an oxygen-containing plasma) can result in more substantial mask loss. The mask in this case was a carbon mask having a thickness of about 440 nm before the deposition process took place. The deposition process involved forming a layer of silicon oxide to line the sidewalls of partially etched cylinders defined by the mask layer. The silicon oxide was deposited using the method 250 shown in FIG. 2B. During deposition of the silicon oxide, the substrate was exposed to an $O_2$ plasma diluted with COS and Ar, and generated using (a) an HF RF component at about 60 MHz provided at about 300 W per 300 mm substrate, and (b) an LF RF component at about 2 MHz provided at varying power levels. The gas flows used to generate the plasma during the oxidation step (operation 255) were provided at a volumetric ratio of about 30 COS/50 O2, and 50 Ar. The first reactant was $SiCl_4$ and the second reactant included $O_2$ and COS. As shown in FIG. 2E, higher amounts of LF RF power at 2 MHz during exposure to the oxygen-containing plasma result in more substantial mask loss during the deposition. The mask loss was minimal where no LF RF power was used during exposure to the oxygen-containing plasma.

In a number of embodiments, the plasma is generated using only high frequency (HF) RF power when the substrate is exposed to the second reactant (e.g., during exposure to an oxygen-containing plasma). More specifically, the plasma may be generated using only RF power provided at a frequency above about 2 MHz, or above about 25 MHz. LF RF power has been shown to degrade certain mask materials, as shown in FIG. 2E. In a particular embodiment the HF RF power is provided at a frequency of about 60 MHz, though other HF RF frequencies may also be used.

Much of the discussion herein with regard to detrimental LF RF bias relates to the bias applied to the substrate during exposure to an oxygen-containing plasma. Application of an LF RF bias to the substrate at other times may be less detrimental. For instance, the substrate may be biased at LF and/or HF RF frequencies during delivery of the first reactant (e.g., during operation 253 of FIG. 2B) and/or during delivery of an inert gas to purge the chamber of the first reactant (e.g., during operation 255 of FIG. 2B). In a particular embodiment, the substrate may be biased using both LF and HF RF frequencies during exposure to the first reactant, and using only HF RF frequencies during exposure to the inert gas (to purge the first reactant), and during exposure to the second reactant.

In one example, features may be etched into a 300 mm diameter substrate having an oxidation sensitive mask using the methods shown in FIGS. 2A and 2B. The values listed in this example are not intended to be limiting. After partially etching the features in operations 201/203, a protective coating of a silicon oxide-based material is deposited in operation 205 using method 250. To deposit the protective coating, a first reactant is flowed into a reaction chamber in operation 251. In this example, the first reactant is $SiCl_4$ (or another silicon-containing reactant), which is provided in argon as a carrier gas. The $SiCl_4$ may be provided at a rate of about 20 sccm and the argon may be provided at a rate of about 100 sccm.

A plasma is generated from the first reactant by applying an RF bias on the substrate. In this example, the plasma is initially generated using HF frequency (e.g., about 60 MHz) provided at about 10 W (about 140 $W/m^2$), as well as LF frequency (e.g., about 2 MHz) provided at about 100 W (about 1,400 $W/m^2$). After some time, in a particular example about 3 seconds, the flow of the first reactant ceases and inert gas is flowed into the chamber in operation 253 to purge the first reactant from the chamber. The inert gas may flow at a rate of about 100 sccm for a duration of about 10 seconds. During this step, the RF component of the bias (e.g., at 60 MHz) may be increased, for example to about 50 W (about 700 $W/m^2$), and the LF component of the bias may be ceased. In this example the purge gas is argon, which may be provided at a rate of about 100 sccm for a duration of about 10 seconds. The plasma is maintained continuously during this transition from flowing the first reactant to flowing the inert gas. The flow of inert gas may begin before the flow of the first reactant ceases. In this and other examples, the inert gas used to purge the first reactant from the reaction chamber is the same as the carrier gas used to provide the first reactant. As such, operation 253 may simply involve ceasing the flow of the first reactant, and optionally increasing the flow of the inert gas (in this example the flow of inert gas remains constant). As explained, this operation may also involve changing the bias applied to the substrate.

After the first reactant is purged from the reaction chamber in operation 253, the second reactant may be introduced to the chamber in operation 255. The plasma may be maintained continuously during this transition from flowing the inert gas to flowing the second reactant. In this example the second reactant is COS, which flows at a rate of about 30 sccm. The second reactant is provided in a carrier gas, which in this example is argon that flows at a rate of about 100 sccm. When the second reactant is being flowed into the reaction chamber, the bias applied to the substrate may be increased. In this example, the bias applied to the substrate during operation 255 includes an HF component (e.g., at 60 MHz) provided at about 300 W (about 4,250 $W/m^2$), and no LF component. After some time, in this example about 10 seconds, the flow of the second reactant ceases, the plasma is extinguished, and the reaction chamber is purged with inert gas. The method 250 may then be repeated until the protective film reaches its final thickness. After the final thickness is reached, the method shown in FIG. 2A may continue with operation 211. Operations 211-219 may then be repeated until the feature is fully etched.

Figure 2F:
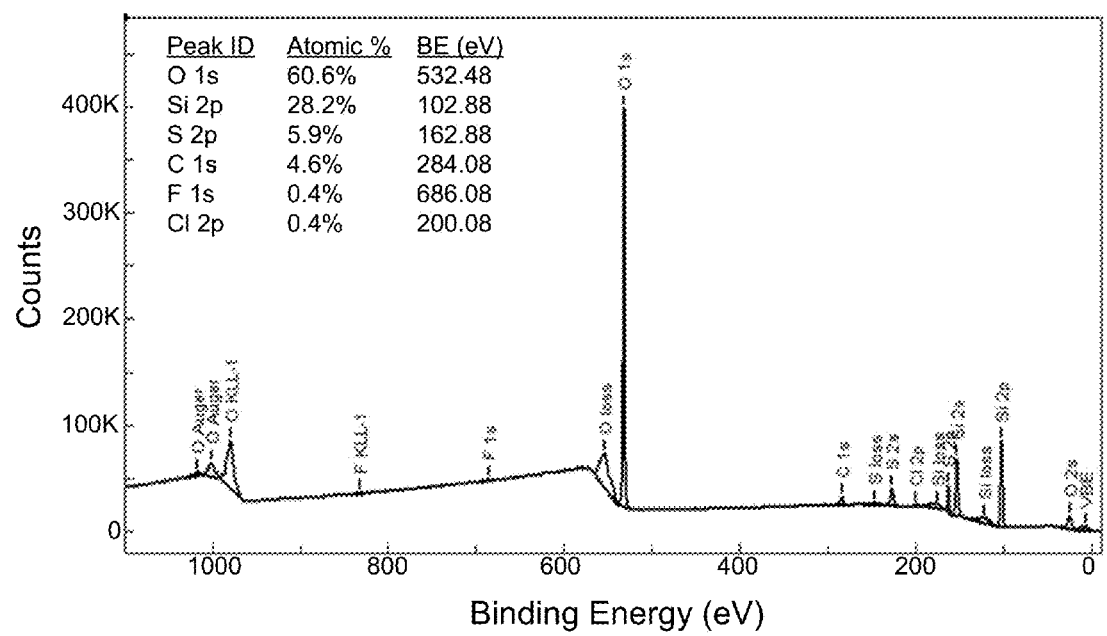
FIG. 2F shows the composition of a protective sidewall film according to one embodiment.

FIG. 2F presents a graph showing the composition of a protective sidewall film formed according to the above described method 250 where the first reactant was $SiCl_4$ and the second reactant was COS (provided in Ar). The results in FIG. 2F show that the film included about 60% oxygen, about 28% silicon, about 6% sulfur, about 5% carbon, about 0.4% fluorine, and about 0.4% chlorine. These values are provided as atomic percentages. In various embodiments, a film formed according to methods herein has a composition similar to that shown in FIG. 2F. For instance, the film may have a composition that is between about 60-65% oxygen, between about 25-30% silicon, between about 3-5% carbon, between about 0.1-0.5% fluorine, between about 4-6% sulfur and between about 0.1-0.5% chlorine. In some other cases, the film may have a composition that falls within one or more, but not all, of these ranges. In still other cases, the film formed may have a composition that does not fall within any of these ranges.

The results in FIG. 2F show dominant Si 2p, S 2p, and O 1s peaks, which may indicate formation of heavily oxidized silicon. The results also show a medium intensity signal from C 1s and S 2p peaks, which may suggest formation of S—C and/or Si—C bonds. The Cl 2p signal is within the noise level, which supports the hypothesis that sulfur-containing reactants help effectively remove chlorine from the film. As compared to film formed through a process where the second reactant was $O_2$ (results not shown), the film analyzed in FIG. 2F showed a lower chlorine content. The F 1s signal is also within the noise level, and may indicate some contribution to the film from the chamber itself.

Figure 2G:
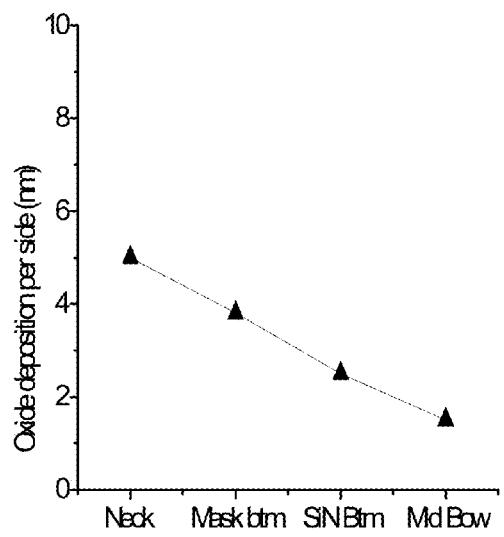
FIG. 2G is a graph depicting the thickness of the protective sidewall film at various portions of a recessed feature according to certain embodiments.

FIG. 2G presents a graph showing the deposition thickness achieved at different portions of the partially etched features where the protective sidewall film was formed according to the above described method 250 where the first reactant was $SiCl_4$ and the second reactant was COS (provided in Ar). The features in this case were partially etched cylinders. The "Neck" refers to the portion of the cylinder near the top, where it is narrowest. The "Mask btm" refers to the bottom of the mask layer, where it meets an underlying layer of SiN. The "SiN Btm" refers to the bottom of the SiN layer where the SiN meets a stack of alternating layers of material. The "MidBow" refers to a portion of the sidewall where the critical dimension is the greatest, in this case close to the middle of the sidewall. In this example, the deposition thickness ranges between about 2-5 nm. This thickness relates to the thickness of film deposited on each side of the feature. The partially etched feature in this example had an aspect ratio of about 20. Similar experiments showed fairly conformal films deposited at even higher aspect ratios, for example up to about 30 in some cases. FIG. 2G shows that the protective sidewall film was successfully deposited along the entire length of the cylinders, even at a high aspect ratio.

In certain implementations, for example where the deposition occurs through a cyclic process (e.g., an ALD method or ALD-like method), the conformality of the film may be particularly good. As used herein, conformality is determined as a variation in film thickness deposited on the sidewalls. For example, the film thickness may be determined at a particular reference spot within the feature (e.g., at an aspect ratio of about 20) and the film thickness at other spots may be normalized based on this thickness. In various embodiments, the maximum deposition thickness within the feature is less than about 400% of the thickness deposited at a reference aspect ratio (e.g., at an AR of about 20).

In another example, the protective film may be a silicon-based film that includes some combination of silicon, carbon, and hydrogen. The first reactant may be any of the silicon-containing reactants listed herein, with $SiCl_4$ as one particular example. The second reactant may be selected from the group consisting of $CS_2$, $CH_4$, $C_2H_4$, $C_2H_6$, other hydrocarbons, and combinations thereof. The reaction used to deposit the film may be an ALD reaction, an ALD-like reaction as described in relation to FIG. 2B, a CVD reaction, or another type of deposition reaction. It is expected that such chemistries can be used without substantially degrading an oxidation sensitive mask layer.

V. Apparatus

The methods described herein may be performed by any suitable apparatus or combination of apparatus. A suitable apparatus includes hardware for accomplishing the process operations and a system controller having instructions for controlling process operations in accordance with the present invention. For example, in some embodiments, the hardware may include one or more process stations included in a process tool. One process station may be an etching station and another process station may be a deposition station. In another embodiment, etching and deposition occur in a single station/chamber.

Figure 4A:
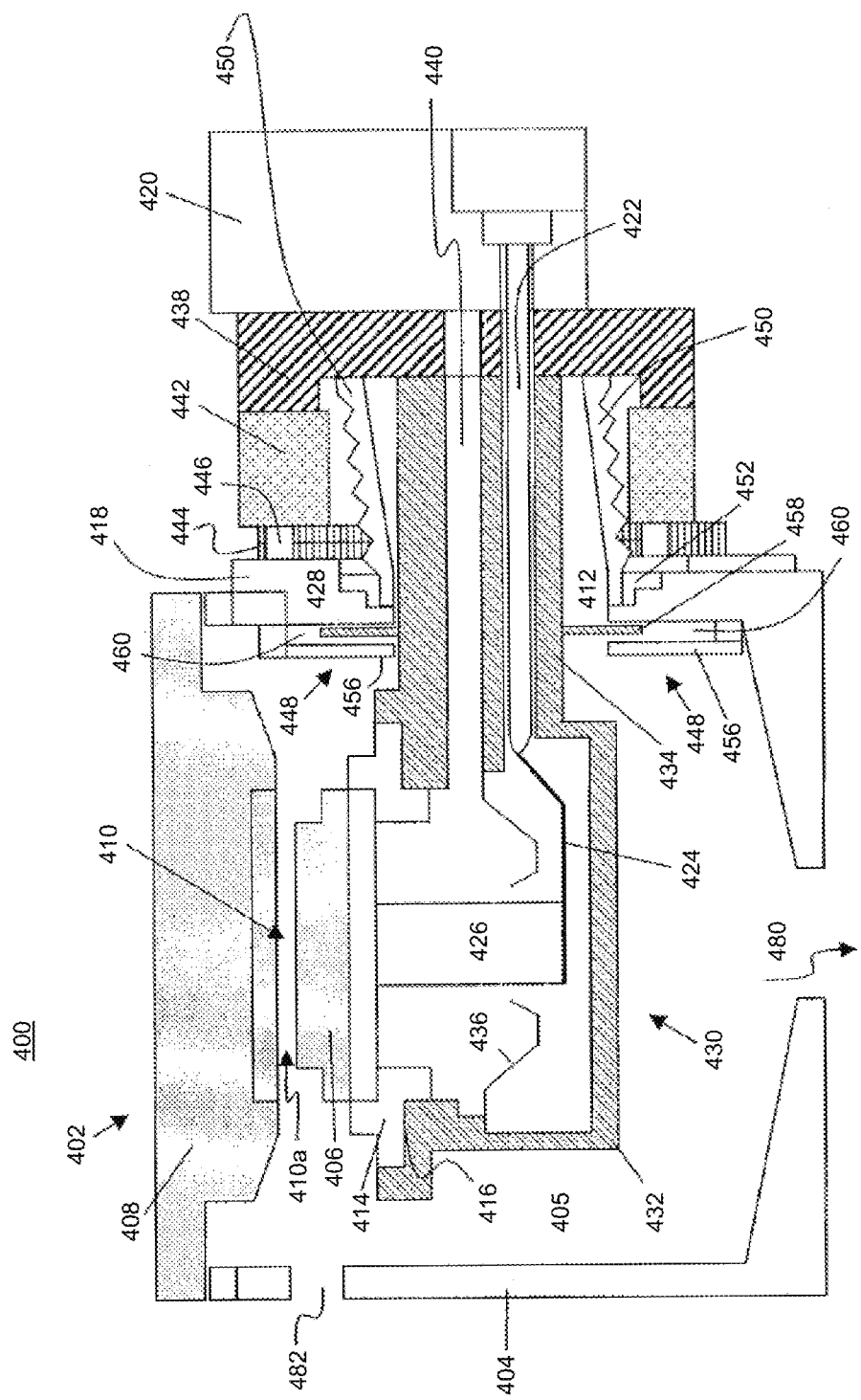
FIGS. 4A-4C illustrate a reaction chamber that may be used to perform the etching processes described herein according to certain embodiments.
Figure 4B:
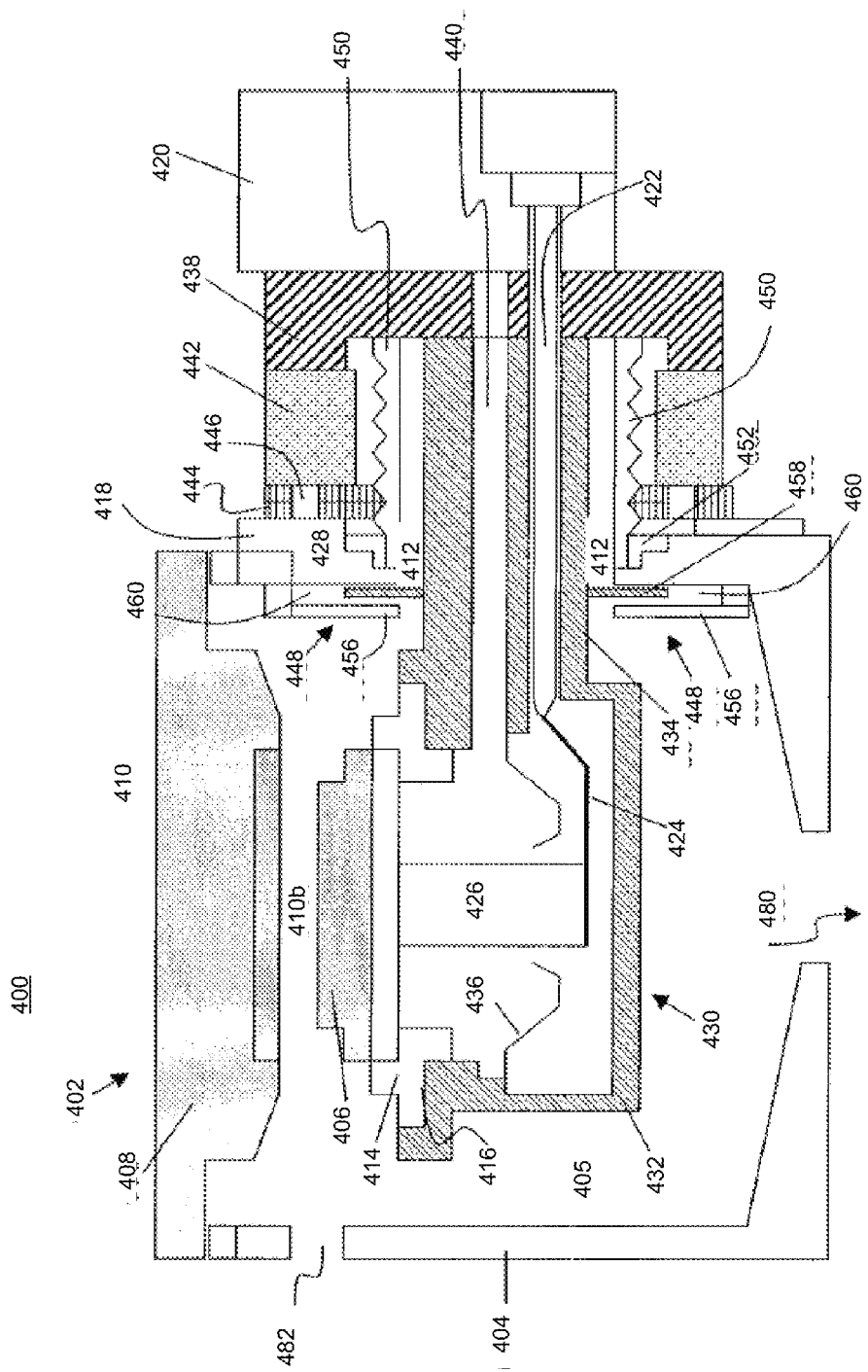
Figure 4C:
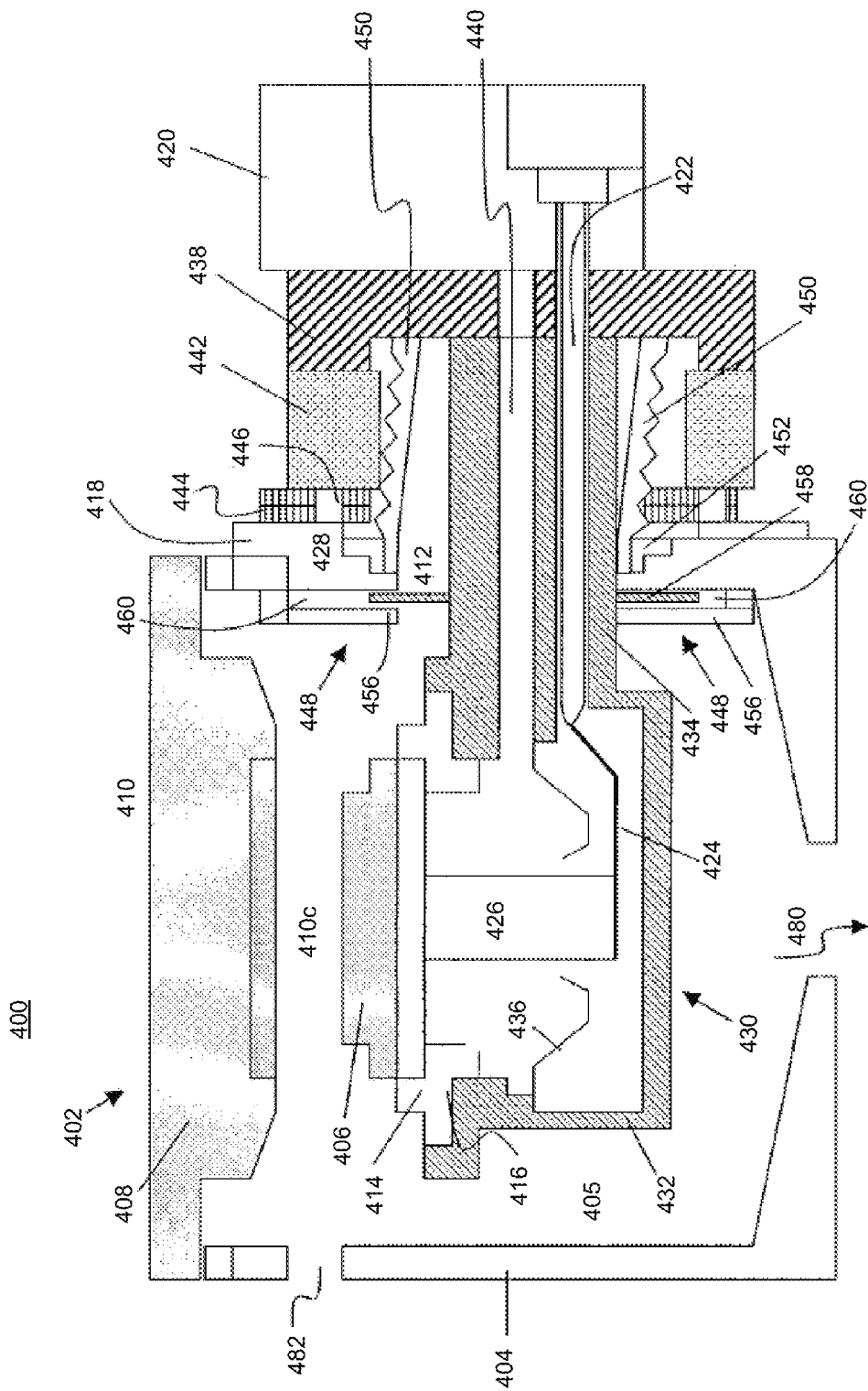

FIGS. 4A-4C illustrate an embodiment of an adjustable gap capacitively coupled confined RF plasma reactor 400 that may be used for performing the etching operations described herein. As depicted, a vacuum chamber 402 includes a chamber housing 404, surrounding an interior space housing a lower electrode 406. In an upper portion of the chamber 402 an upper electrode 408 is vertically spaced apart from the lower electrode 406. Planar surfaces of the upper and lower electrodes 408, 406 are substantially parallel and orthoganol to the vertical direction between the electrodes. Preferably the upper and lower electrodes 408, 406 are circular and coaxial with respect to a vertical axis. A lower surface of the upper electrode 408 faces an upper surface of the lower electrode 406. The spaced apart facing electrode surfaces define an adjustable gap 410 therebetween. During operation, the lower electrode 406 is supplied RF power by an RF power supply (match) 420. RF power is supplied to the lower electrode 406 though an RF supply conduit 422, an RF strap 424 and an RF power member 426. A grounding shield 436 may surround the RF power member 426 to provide a more uniform RF field to the lower electrode 406. As described in commonly-owned U.S. Pat. No. 7,732,728, the entire contents of which are herein incorporated by reference, a wafer is inserted through wafer port 482 and supported in the gap 410 on the lower electrode 406 for processing, a process gas is supplied to the gap 410 and excited into plasma state by the RF power. The upper electrode 408 can be powered or grounded.

In the embodiment shown in FIGS. 4A-4C, the lower electrode 406 is supported on a lower electrode support plate 416. An insulator ring 414 interposed between the lower electrode 406 and the lower electrode Support plate 416 insulates the lower electrode 406 from the support plate 416.

An RF bias housing 430 supports the lower electrode 406 on an RF bias housing bowl 432. The bowl 432 is connected through an opening in a chamber wall plate 418 to a conduit support plate 438 by an arm 434 of the RF bias housing 430. In a preferred embodiment, the RF bias housing bowl 432 and RF bias housing arm 434 are integrally formed as one component, however, the arm 434 and bowl 432 can also be two separate components bolted or joined together.

The RF bias housing arm 434 includes one or more hollow passages for passing RF power and facilities, such as gas coolant, liquid coolant, RF energy, cables for lift pin control, electrical monitoring and actuating signals from outside the vacuum chamber 402 to inside the vacuum chamber 402 at a space on the backside of the lower electrode 406. The RF supply conduit 422 is insulated from the RF bias housing arm 434, the RF bias housing arm 434 providing a return path for RF power to the RF power supply 420. A facilities conduit 440 provides a passageway for facility components. Further details of the facility components are described in U.S. Pat. Nos. 5,948,704 and 7,732,728 and are not shown here for simplicity of description. The gap 410 is preferably surrounded by a confinement ring assembly or shroud (not shown), details of which can be found in commonly owned published U.S. Pat. No. 7,740,736 herein incorporated by reference. The interior of the vacuum chamber 402 is maintained at a low pressure by connection to a vacuum pump through vacuum portal 480.

The conduit support plate 438 is attached to an actuation mechanism 442. Details of an actuation mechanism are described in commonly-owned U.S. Pat. No. 7,732,728 incorporated herein by above. The actuation mechanism 442, such as a servo mechanical motor, stepper motor or the like is attached to a vertical linear bearing 444, for example, by a screw gear 446 such as a ball screw and motor for rotating the ball screw. During operation to adjust the size of the gap 410, the actuation mechanism 442 travels along the vertical linear bearing 444. FIG. 4A illustrates the arrangement when the actuation mechanism 442 is at a high position on the linear bearing 444 resulting in a small gap 410 a. FIG. 4B illustrates the arrangement when the actuation mechanism 442 is at a mid position on the linear bearing 444. As shown, the lower electrode 406, the RF bias housing 430, the conduit support plate 438, the RF power supply 420 have all moved lower with respect to the chamber housing 404 and the upper electrode 408, resulting in a medium size gap 410 b.

FIG. 4C illustrates a large gap 410 c when the actuation mechanism 442 is at a low position on the linear bearing. Preferably, the upper and lower electrodes 408, 406 remain coaxial during the gap adjustment and the facing surfaces of the upper and lower electrodes across the gap remain parallel.

This embodiment allows the gap 410 between the lower and upper electrodes 406, 408 in the CCP chamber 402 during multi-step process recipes (BARC, HARC, and STRIP etc.) to be adjusted, for example, in order to maintain uniform etch across a large diameter substrate such as 300 mm wafers or flat panel displays. In particular, this chamber pertains to a mechanical arrangement that permits the linear motion necessary to provide the adjustable gap between lower and upper electrodes 406, 408.

FIG. 4A illustrates laterally deflected bellows 450 sealed at a proximate end to the conduit support plate 438 and at a distal end to a stepped flange 428 of chamber wall plate 418. The inner diameter of the stepped flange defines an opening 412 in the chamber wall plate 418 through which the RF bias housing arm 434 passes. The distal end of the bellows 450 is clamped by a clamp ring 452.

The laterally deflected bellows 450 provides a vacuum seal while allowing vertical movement of the RF bias housing 430, conduit support plate 438 and actuation mechanism 442. The RF bias housing 430, conduit support plate 438 and actuation mechanism 442 can be referred to as a cantilever assembly. Preferably, the RF power supply 420 moves with the cantilever assembly and can be attached to the conduit support plate 438. FIG. 4B shows the bellows 450 in a neutral position when the cantilever assembly is at a mid position. FIG. 4C shows the bellows 450 laterally deflected when the cantilever assembly is at a low position.

A labyrinth seal 448 provides a particle barrier between the bellows 450 and the interior of the plasma processing chamber housing 404. A fixed shield 456 is immovably attached to the inside inner wall of the chamber housing 404 at the chamber wall plate 418 so as to provide a labyrinth groove 460 (slot) in which a movable shield plate 458 moves vertically to accommodate vertical movement of the cantilever assembly. The outer portion of the movable shield plate 458 remains in the slot at all vertical positions of the lower electrode 406.

In the embodiment shown, the labyrinth seal 448 includes a fixed shield 456 attached to an inner surface of the chamber wall plate 418 at a periphery of the opening 412 in the chamber wall plate 418 defining a labyrinth groove 460. The movable shield plate 458 is attached and extends radially from the RF bias housing arm 434 where the arm 434 passes through the opening 412 in the chamber wall plate 418. The movable shield plate 458 extends into the labyrinth groove 460 while spaced apart from the fixed shield 456 by a first gap and spaced apart from the interior surface of the chamber wall plate 418 by a second gap allowing the cantilevered assembly to move vertically. The labyrinth seal 448 blocks migration of particles spalled from the bellows 450 from entering the vacuum chamber interior 405 and blocks radicals from process gas plasma from migrating to the bellows 450 where the radicals can form deposits which are subsequently spalled.

FIG. 4A shows the movable shield plate 458 at a higher position in the labyrinth groove 460 above the RF bias housing arm 434 when the cantilevered assembly is in a high position (small gap 410 a). FIG. 4C shows the movable shield plate 458 at a lower position in the labyrinth groove 460 above the RF bias housing arm 434 when the cantilevered assembly is in a low position (large gap 410 c). FIG. 4B shows the movable shield plate 458 in a neutral or mid position within the labyrinth groove 460 when the cantilevered assembly is in a mid position (medium gap 410 b). While the labyrinth seal 448 is shown as symmetrical about the RF bias housing arm 434, in other embodiments the labyrinth seal 448 may be asymmetrical about the RF bias arm 434.

Figure 5:
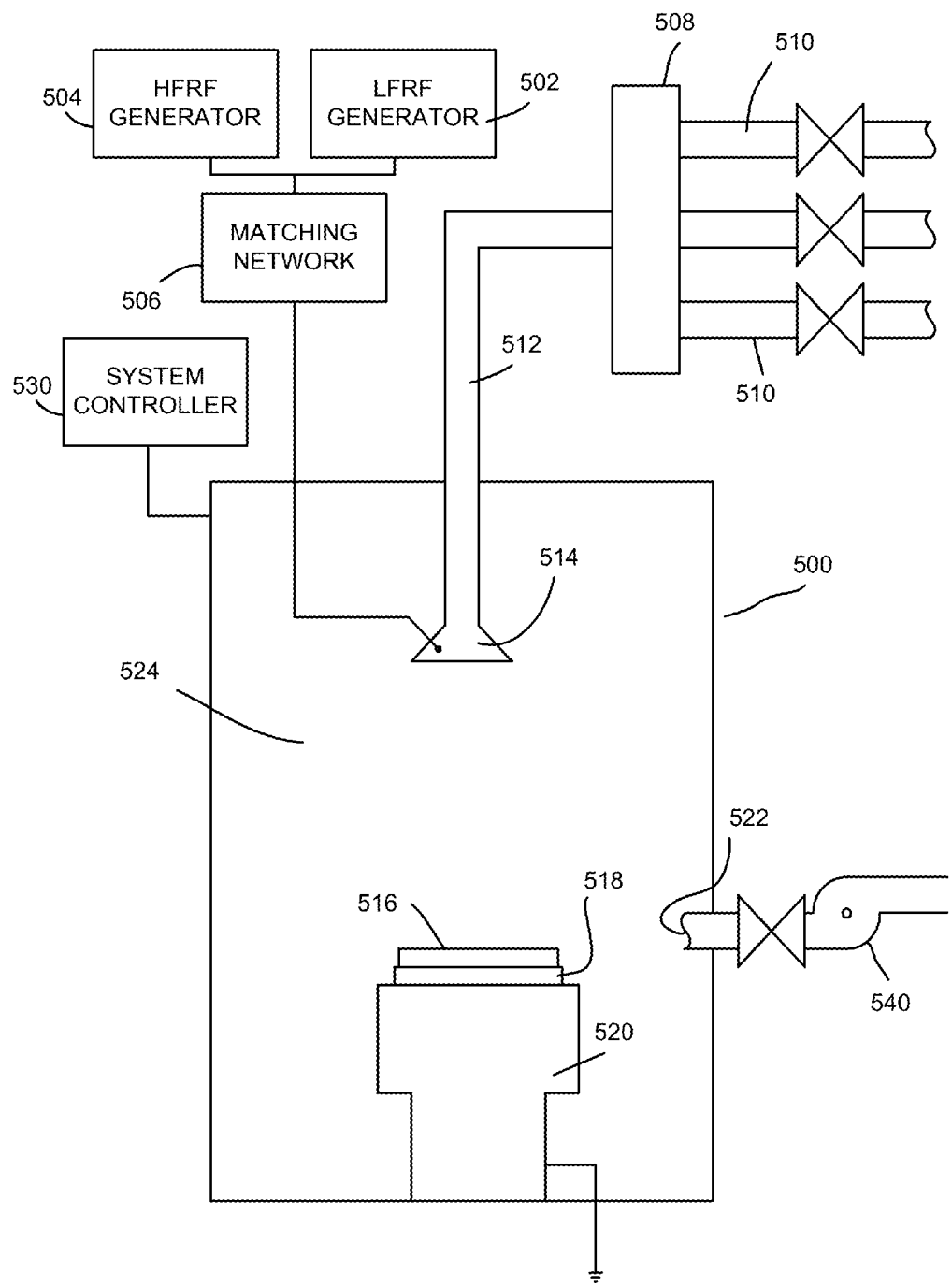
FIG. 5 depicts a reaction chamber that may be used to perform the deposition processes described herein according to certain embodiments.

FIG. 5 provides a simple block diagram depicting various reactor components arranged for implementing deposition methods described herein. As shown, a reactor 500 includes a process chamber 524 that encloses other components of the reactor and serves to contain a plasma generated by a capacitive-discharge type system including a showerhead 514 working in conjunction with a grounded heater block 520. A high frequency (HF) radio frequency (RF) generator 504 and a low frequency (LF) RF generator 502 may be connected to a matching network 506 and to the showerhead 514. The power and frequency supplied by matching network 506 may be sufficient to generate a plasma from process gases supplied to the process chamber 524. For example, the matching network 506 may provide 50 W to 500 W of HFRF power (e.g., 700 to 7,100 W/m$^2$). In some examples, the matching network 506 may provide 100 W to 5000 W of HFRF power (e.g., 1,400 to 71,000 W/m$^2$) and 100 W to 5000 W (e.g., 1,400 to 71,000 W/m$^2$) of LFRF power. In a typical process, the HFRF component may generally be between 5 MHz to 60 MHz, e.g., 13.56 MHz, about 27 MHz, or about 60 MHz in some cases. In operations where there is an LF component, the LF component may be from about 100 kHz to 2 MHz, e.g., 430 kHz or about 2 MHz in some cases.

Within the reactor, a wafer pedestal 518 may support a substrate 516. The wafer pedestal 518 may include a chuck, a fork, or lift pins (not shown) to hold and transfer the substrate during and between the deposition and/or plasma treatment reactions. The chuck may be an electrostatic chuck, a mechanical chuck, or various other types of chuck as are available for use in the industry and/or for research.

Various process gases may be introduced via inlet 512. Multiple source gas lines 510 are connected to manifold 508. The gases may be premixed or not. Appropriate valving and mass flow control mechanisms may be employed to ensure that the correct process gases are delivered during the deposition and plasma treatment phases of the process. In the case where a chemical precursor(s) is delivered in liquid form, liquid flow control mechanisms may be employed. Such liquids may then be vaporized and mixed with process gases during transportation in a manifold heated above the vaporization point of the chemical precursor supplied in liquid form before reaching the deposition chamber.

Process gases may exit chamber 524 via an outlet 522. A vacuum pump, e.g., a one or two stage mechanical dry pump and/or turbomolecular pump 540, may be used to draw process gases out of the process chamber 524 and to maintain a suitably low pressure within the process chamber 524 by using a closed-loop-controlled flow restriction device, such as a throttle valve or a pendulum valve.

As discussed above, the techniques for deposition discussed herein may be implemented on a multi-station or single station tool. In specific implementations, a 300 mm Lam Vector™ tool having a 4-station deposition scheme or a 200 mm Sequel™ tool having a 6-station deposition scheme may be used. In some implementations, tools for processing 450 mm wafers may be used. In various implementations, the wafers may be indexed after every deposition and/or post-deposition plasma treatment, or may be indexed after etching operations if the etching chambers or stations are also part of the same tool, or multiple depositions and treatments may be conducted at a single station before indexing the wafer.

In some embodiments, an apparatus may be provided that is configured to perform the techniques described herein. A suitable apparatus may include hardware for performing various process operations as well as a system controller 530 having instructions for controlling process operations in accordance with the disclosed embodiments. The system controller 530 will typically include one or more memory devices and one or more processors communicatively connected with various process control equipment, e.g., valves, RF generators, wafer handling systems, etc., and configured to execute the instructions so that the apparatus will perform a technique in accordance with the disclosed embodiments. Machine-readable media containing instructions for controlling process operations in accordance with the present disclosure may be coupled to the system controller 530. The controller 530 may be communicatively connected with various hardware devices, e.g., mass flow controllers, valves, RF generators, vacuum pumps, etc. to facilitate control of the various process parameters that are associated with the deposition operations as described herein.

In some embodiments, a system controller 530 may control all of the activities of the reactor 500. The system controller 530 may execute system control software stored in a mass storage device, loaded into a memory device, and executed on a processor. The system control software may include instructions for controlling the timing of gas flows, wafer movement, RF generator activation, etc., as well as instructions for controlling the mixture of gases, the chamber and/or station pressure, the chamber and/or station temperature, the wafer temperature, the target power levels, the RF power levels, the substrate pedestal, chuck, and/or susceptor position, and other parameters of a particular process performed by the reactor apparatus 500. The system control software may be configured in any suitable way. For example, various process tool component subroutines or control objects may be written to control operation of the process tool components necessary to carry out various process tool processes. The system control software may be coded in any suitable computer readable programming language.

The system controller 530 may typically include one or more memory devices and one or more processors configured to execute the instructions so that the apparatus will perform a technique in accordance with the present disclosure. Machine-readable media containing instructions for controlling process operations in accordance with disclosed embodiments may be coupled to the system controller 530.

Figure 6:
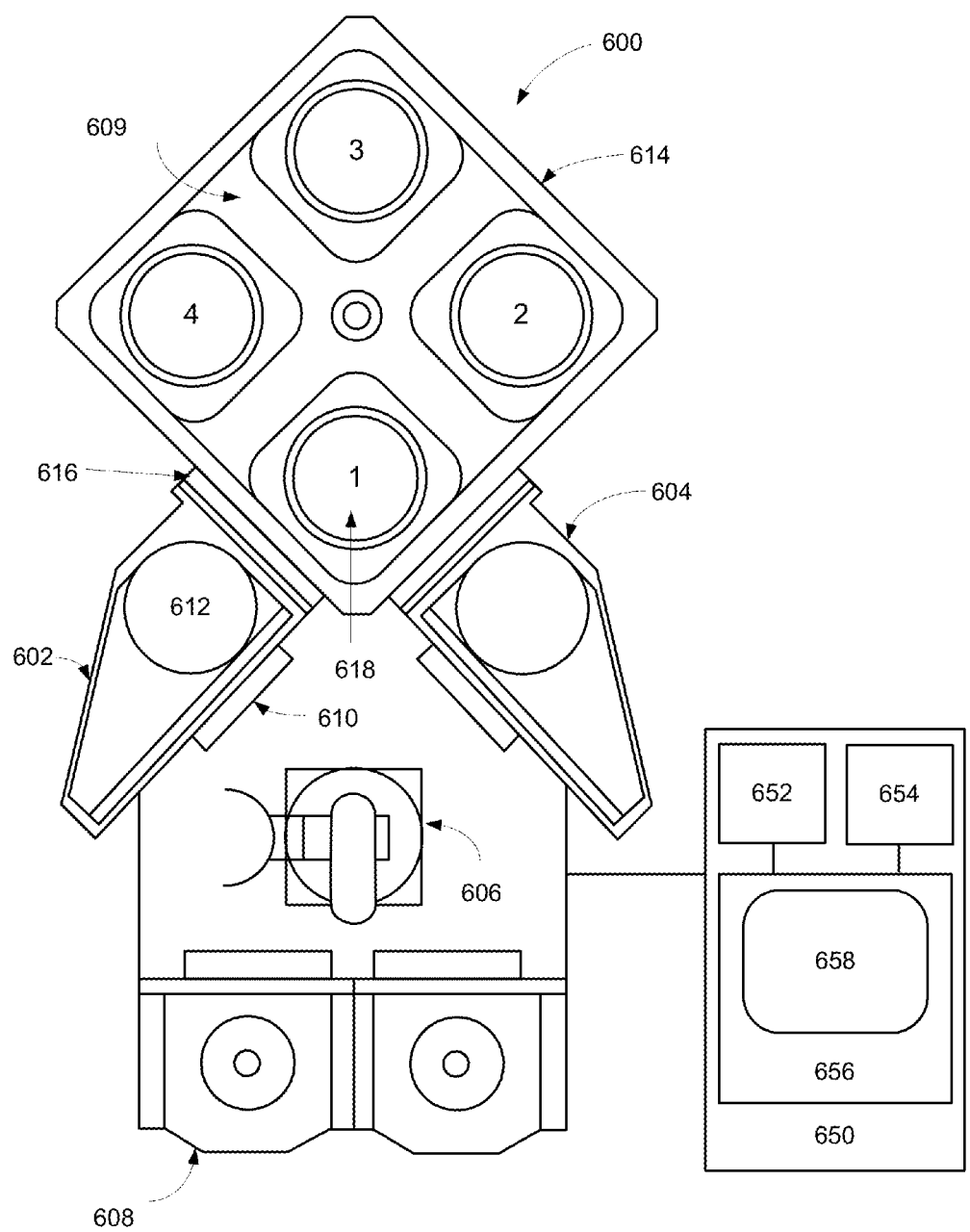
FIG. 6 shows a multi-station apparatus that may be used to perform the deposition processes in certain implementations.

One or more process stations may be included in a multi-station processing tool. FIG. 6 shows a schematic view of an embodiment of a multi-station processing tool 600 with an inbound load lock 602 and an outbound load lock 604, either or both of which may include a remote plasma source. A robot 606, at atmospheric pressure, is configured to move wafers from a cassette loaded through a pod 608 into inbound load lock 602 via an atmospheric port 610. A wafer is placed by the robot 606 on a pedestal 612 in the inbound load lock 602, the atmospheric port 610 is closed, and the load lock is pumped down. Where the inbound load lock 602 includes a remote plasma source, the wafer may be exposed to a remote plasma treatment in the load lock prior to being introduced into a processing chamber 614. Further, the wafer also may be heated in the inbound load lock 602 as well, for example, to remove moisture and adsorbed gases. Next, a chamber transport port 616 to processing chamber 614 is opened, and another robot (not shown) places the wafer into the reactor on a pedestal of a first station shown in the reactor for processing. While the embodiment depicted includes load locks, it will be appreciated that, in some embodiments, direct entry of a wafer into a process station may be provided.

The depicted processing chamber 614 includes four process stations, numbered from 1 to 4 in the embodiment shown in FIG. 6. Each station has a heated pedestal (shown at 618 for station 1), and gas line inlets. It will be appreciated that in some embodiments, each process station may have different or multiple purposes. For example, each of the process stations 1-4 may be a chamber for performing one or more of ALD, CVD, CFD, or etching (any of which may be plasma assisted). In one embodiment, at least one of the process stations is a deposition station having a reaction chamber as shown in FIG. 5, and at least one of the other process stations is an etching station having a reaction chamber as shown in FIGS. 4A-4C. While the depicted processing chamber 614 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 also depicts an embodiment of a wafer handling system 609 for transferring wafers within processing chamber 614. In some embodiments, wafer handling system 609 may transfer wafers between various process stations and/or between a process station and a load lock. It will be appreciated that any suitable wafer handling system may be employed. Non-limiting examples include wafer carousels and wafer handling robots. FIG. 6 also depicts an embodiment of a system controller 650 employed to control process conditions and hardware states of process tool 600. System controller 650 may include one or more memory devices 656, one or more mass storage devices 654, and one or more processors 652. Processor 652 may include a CPU or computer, analog and/or digital input/output connections, stepper motor controller boards, etc.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing operations during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing operations to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing operations to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process operation or operations to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

In certain embodiments, the controller has instructions to perform the operations shown and described in relation to FIG. 2A. For example, the controller may have instructions to cyclically (a) perform an etching operation to partially etch a feature on a substrate, and (b) deposit a protective sidewall coating in the etched feature without substantially etching the substrate. The instructions may relate to performing these processes using the disclosed reaction conditions. The instructions may also relate to transferring the substrate between etching and deposition chambers in some implementations.

Returning to the embodiment of FIG. 6, in some embodiments, system controller 650 controls all of the activities of process tool 600. System controller 650 executes system control software 658 stored in mass storage device 654, loaded into memory device 656, and executed on processor 652. Alternatively, the control logic may be hard coded in the controller 650. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 658 may include instructions for controlling the timing, mixture of gases, chamber and/or station pressure, chamber and/or station temperature, wafer temperature, target power levels, RF power levels, RF exposure time, substrate pedestal, chuck and/or susceptor position, and other parameters of a particular process performed by process tool 600. System control software 658 may be configured in any suitable way. For example, various process tool component subroutines or control objects may be written to control operation of the process tool components necessary to carry out various process tool processes. System control software 658 may be coded in any suitable computer readable programming language.

In some embodiments, system control software 658 may include input/output control (IOC) sequencing instructions for controlling the various parameters described above. For example, each phase of a CFD process may include one or more instructions for execution by system controller 650. The instructions for setting process conditions for an ALD process phase may be included in a corresponding ALD recipe phase. In some embodiments, the ALD recipe phases may be sequentially arranged, so that all instructions for an ALD process phase are executed concurrently with that process phase.

Other computer software and/or programs stored on mass storage device 654 and/or memory device 656 associated with system controller 650 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 618 and to control the spacing between the substrate and other parts of process tool 600.

A process gas control program may include code for controlling gas composition and flow rates and optionally for flowing gas into one or more process stations prior to deposition in order to stabilize the pressure in the process station. In some embodiments, the controller includes instructions for depositing a nanolaminate protective layer on a core layer, and depositing a conformal layer over the protective layer.

A pressure control program may include code for controlling the pressure in the process station by regulating, for example, a throttle valve in the exhaust system of the process station, a gas flow into the process station, etc. In some embodiments, the controller includes instructions for depositing a nanolaminate protective layer on a core layer, and depositing a conformal layer over the protective layer.

A heater control program may include code for controlling the current to a heating unit that is used to heat the substrate. Alternatively, the heater control program may control delivery of a heat transfer gas (such as helium) to the substrate. In certain implementations, the controller includes instructions for depositing a nanolaminate protective layer at a first temperature, and a conformal layer over the protective layer at a second temperature, where the second temperature is higher than the first temperature.

A plasma control program may include code for setting RF power levels and exposure times in one or more process stations in accordance with the embodiments herein. In some embodiments, the controller includes instructions for depositing a nanolaminate protective layer at a first RF power level and RF duration, and depositing a conformal layer over the protective layer at a second RF power level and RF duration. The second RF power level and/or the second RF duration may be higher/longer than the first RF power level/duration.

In some embodiments, there may be a user interface associated with system controller 650. The user interface may include a display screen, graphical software displays of the apparatus and/or process conditions, and user input devices such as pointing devices, keyboards, touch screens, microphones, etc.

In some embodiments, parameters adjusted by system controller 650 may relate to process conditions. Non-limiting examples include process gas composition and flow rates, temperature, pressure, plasma conditions (such as RF bias power levels and exposure times), etc. These parameters may be provided to the user in the form of a recipe, which may be entered utilizing the user interface.

Signals for monitoring the process may be provided by analog and/or digital input connections of system controller 650 from various process tool sensors. The signals for controlling the process may be output on the analog and digital output connections of process tool 600. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 650 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the disclosed embodiments. Machine-readable, non-transitory media containing instructions for controlling process operations in accordance with the disclosed embodiments may be coupled to the system controller.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Figure 7:
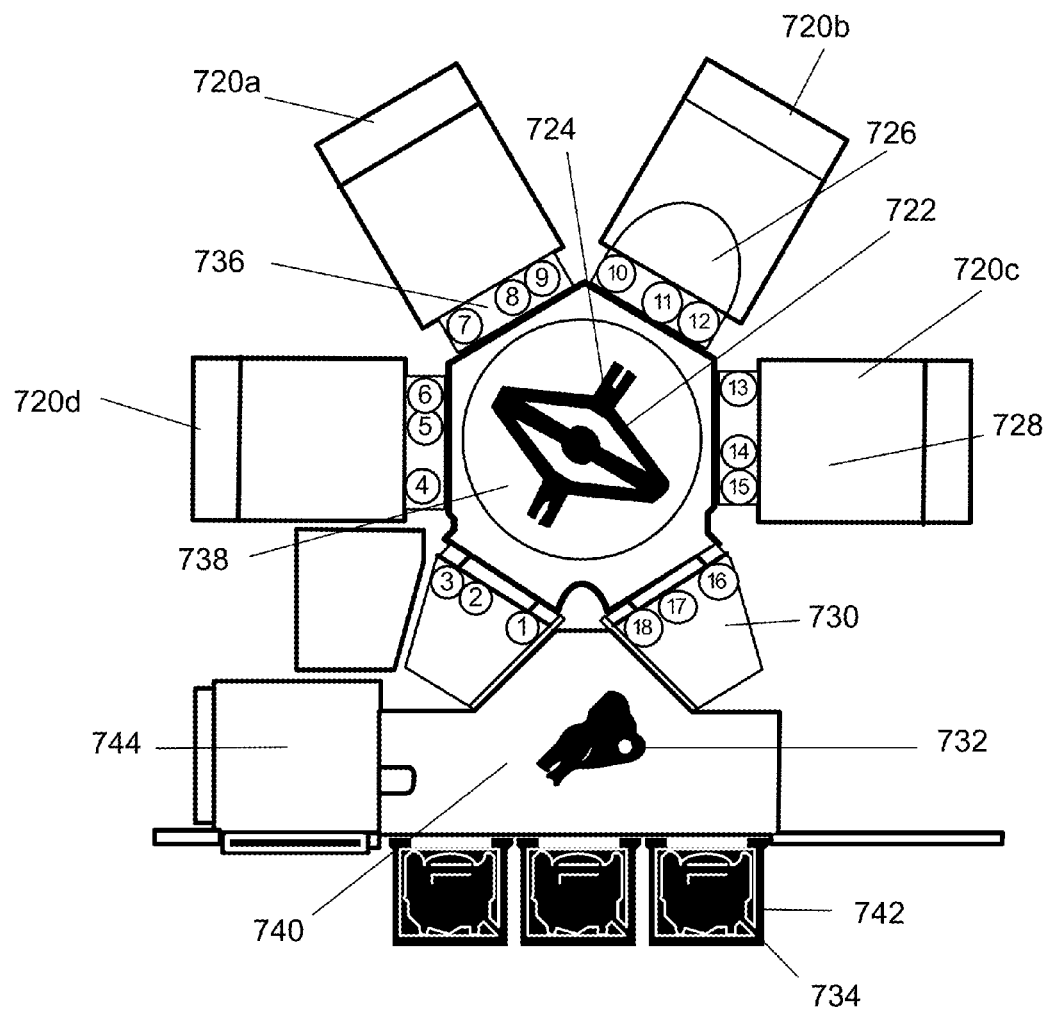
FIG. 7 presents a cluster tool that may be used to practice both deposition and etching according to certain embodiments.

FIG. 7 depicts a semiconductor process cluster architecture with various modules that interface with a vacuum transfer module 738 (VTM). The arrangement of transfer modules to "transfer" substrates among multiple storage facilities and processing modules may be referred to as a "cluster tool architecture" system. Airlock 730, also known as a loadlock or transfer module, is shown in VTM 738 with four processing modules 720a-720d, which may be individual optimized to perform various fabrication processes. By way of example, processing modules 720a-720d may be implemented to perform substrate etching, deposition, ion implantation, substrate cleaning, sputtering, and/or other semiconductor processes as well as laser metrology and other defect detection and defect identification methods. One or more of the processing modules (any of 720a-720d) may be implemented as disclosed herein, i.e., for etching recessed features into substrates, depositing protective films on sidewalls of recessed features, and other suitable functions in accordance with the disclosed embodiments. Airlock 730 and process modules 720a-720d may be referred to as "stations." Each station has a facet 736 that interfaces the station to VTM 738. Inside the facets, sensors 1-18 are used to detect the passing of substrate 726 when moved between respective stations.

Robot 722 transfers substrates between stations. In one implementation, the robot may have one arm, and in another implementation, the robot may have two arms, where each arm has an end effector 724 to pick substrates for transport. Front-end robot 732, in atmospheric transfer module (ATM) 740, may be used to transfer substrates from cassette or Front Opening Unified Pod (FOUP) 734 in Load Port Module (LPM) 742 to airlock 730. Module center 728 inside process modules 720a-720d may be one location for placing the substrate. Aligner 744 in ATM 740 may be used to align substrates.

In an exemplary processing method, a substrate is placed in one of the FOUPs 734 in the LPM 742. Front-end robot 732 transfers the substrate from the FOUP 734 to the aligner 744, which allows the substrate 726 to be properly centered before it is etched, or deposited upon, or otherwise processed. After being aligned, the substrate is moved by the front-end robot 732 into an airlock 730. Because airlock modules have the ability to match the environment between an ATM and a VTM, the substrate is able to move between the two pressure environments without being damaged. From the airlock module 730, the substrate is moved by robot 722 through VTM 738 and into one of the process modules 720a-720d, for example process module 720a. In order to achieve this substrate movement, the robot 722 uses end effectors 724 on each of its arms. In process module 720a, the substrate undergoes etching as described herein to form a partially etched feature. Next, the robot 722 moves the substrate out of processing module 720a, into the VTM 738, and then into a different processing module 720b. In processing module 720b, a protective film is deposited on sidewalls of the partially etched feature. Then, the robot 722 moves the substrate out of processing module 720b, into the VTM 738, and into processing module 720a, where the partially etched feature is further etched. The etching/deposition can be repeated until the feature is fully etched.

It should be noted that the computer controlling the substrate movement can be local to the cluster architecture, or can be located external to the cluster architecture in the manufacturing floor, or in a remote location and connected to the cluster architecture via a network.

Lithographic patterning of a film typically comprises some or all of the following operations, each operation enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of forming an etched feature in dielectric material on a semiconductor substrate, the method comprising:
   (a) generating an etching plasma comprising an etching reactant, exposing the substrate to the etching plasma, and partially etching the feature in the dielectric material, wherein the substrate comprises a mask layer;
   (b) after (a), depositing a protective film on sidewalls of the feature, wherein the protective film is deposited along substantially the entire depth of the feature, wherein the mask layer is substantially preserved during (b), and wherein depositing the protective film comprises:
      (i) flowing a first deposition reactant into a reaction chamber, generating a deposition plasma comprising the first deposition reactant, and exposing the substrate to the deposition plasma, wherein the first deposition reactant is a silicon-containing reactant,
      (ii) ceasing the flow of the first deposition reactant,
      (iii) flowing a second deposition reactant into the reaction chamber and generating or maintaining the deposition plasma to thereby drive a surface reaction between the first and second deposition reactants to form the protective film, the deposition plasma in (iii) comprising the second deposition reactant, wherein the mask layer is substantially preserved during (iii), and wherein a composition of the deposition plasma changes over the course of (i)-(iii),
      (iv) ceasing the flow of the second deposition reactant, and
      (v) repeating (i)-(iv) until the protective film reaches a final thickness; and
   (c) repeating (a)-(b) until the feature is etched to a final depth, wherein the protective film deposited in (b) substantially prevents lateral etch of the feature during (a), and wherein the feature has an aspect ratio of about 5 or greater at its final depth.

2. The method of claim 1, further comprising:
   after (ii) and before (iii), flowing inert gas into the reaction chamber to sweep non-adsorbed first deposition reactant from the reaction chamber, and
   after (iv) and before a subsequent iteration of (i), flowing inert gas into the reaction chamber to sweep non-adsorbed second deposition reactant from the reaction chamber.

3. The method of claim 2, wherein the deposition plasma is continuously maintained during (i)-(iii).

4. The method of claim 1, wherein the deposition plasma is continuously maintained during (i)-(iii).

5. The method of claim 1, wherein the deposition plasma is not continuously maintained during (i)-(iii).

6. The method of claim 1, wherein the first deposition reactant comprises $SiCl_4$.

7. The method of claim 1, wherein the second deposition reactant comprises one or more reactants selected from the group consisting of: COS, CO, $SO_2$, $CO_2$, NO, $N_2O$, $N_2O_5$, $NO_2$, $N_2O_3$, $N_2O_4$, $H_2O$, $H_2CO$, $CS_2$, $CH_4$, $C_2H_4$, and $C_2H_6$.

8. The method of claim 1, wherein the second deposition reactant comprises a sulfur-containing reactant.

9. The method of claim 8, wherein the mask layer is sensitive to oxidation damage, and wherein the first deposition reactant comprises $SiCl_4$ and the second deposition reactant comprises COS.

10. The method of claim 1, wherein the deposition plasma is generated using HF RF power and optionally using LF RF power, wherein an LF RF power density, if LF RF power is used, is less than about 2,800 $W/m^2$ during (b)(iii).

11. The method of claim 10, wherein the LF RF power density, if LF RF power is used, is less than about 700 $W/m^2$ during (b)(iii).

12. The method of claim 11, wherein the deposition plasma is generated using only RF frequencies greater than about 2 MHz during (b)(iii).

13. The method of claim 1, wherein the mask layer is sensitive to oxidation damage, and wherein the deposition plasma during (b)(iii) is generated from a plasma generation gas that comprises less than about 20% $O_2$, as measured volumetrically.

14. The method of claim 1, wherein at the final depth, (i) the aspect ratio of the feature is about 20 or greater, and (ii) a maximum critical dimension of the feature is no more than about 10% greater than a critical dimension at the bottom of the feature.

15. The method of claim 1, wherein the feature is formed while forming a VNAND device, and wherein the dielectric material comprises alternating layers of (i) a silicon oxide material, and (ii) a silicon nitride material or polysilicon material.

16. The method of claim 1, wherein the feature is formed while forming a DRAM device, and wherein the dielectric material comprises silicon oxide.

17. The method of claim 1, wherein the aspect ratio of the feature is about 50 or greater at the final depth.

18. The method of claim 1, wherein (a) and (b) are repeated at least one time, wherein (b) may or may not be performed using the same reactants during each iteration.

19. The method of claim 1, wherein the mask layer comprises spin-on carbon, amorphous carbon and/or photoresist.

20. A method of forming an etched feature in dielectric material on a semiconductor substrate, the method comprising:
   (a) generating an etching plasma comprising an etching reactant, exposing the substrate to the etching plasma, and partially etching the feature in the dielectric material, wherein the substrate comprises a mask layer;
   (b) after (a), depositing a protective film on sidewalls of the feature, wherein the protective film is deposited along substantially the entire depth of the feature, and wherein the mask layer is substantially preserved during (b), wherein depositing the protective film comprises the following steps performed in a cyclic manner:
      (i) flowing a first deposition reactant into a reaction chamber and allowing the first deposition reactant to adsorb onto the substrate surface, wherein the first deposition reactant is a silicon-containing reactant; and (ii) flowing a second deposition reactant into the reaction chamber, wherein the first and second deposition reactants react to form the protective film; and (c) repeating (a)-(b) until the feature is etched to a final depth, wherein the protective film deposited in (b) substantially prevents lateral etch of the feature during (a), and wherein the feature has an aspect ratio of about 5 or greater at its final depth.

21. The method of claim 20, wherein depositing the protective film occurs through a plasma assisted atomic layer deposition reaction that comprises (i), (ii), and (iii) generating a deposition plasma in the reaction chamber and exposing the substrate to the deposition plasma to drive a surface reaction between the first and second deposition reactants to thereby form the protective film, wherein (i)-(iii) are performed cyclically.

22. A method of depositing a silicon-containing film on a substrate, the method comprising:

(a) flowing a first reactant into a reaction chamber and exposing the substrate to plasma comprising the first reactant, wherein the first reactant comprises a silicon-containing reactant;

(b) flowing a second reactant into the reaction chamber and exposing the substrate to plasma comprising the second reactant, wherein the second reactant comprises carbonyl sulfide (COS);

(c) reacting the first and second reactant to thereby deposit the silicon-containing film on the substrate, wherein during (a)-(c), a composition of the plasma changes over time such that during a first stage during (a) the plasma comprises the first reactant but not the second reactant, during a second stage the plasma comprises inert gas and neither the first nor second reactant, and during a third stage during (b) the plasma comprises the second reactant but not the first reactant, wherein the first, second, and third stages occur in that order; and (d) cyclically repeating the first, second, and third stages until the silicon-containing film reaches a final thickness.

23. The method of claim 22, wherein the plasma is extinguished at least once after the first reactant is delivered and before the second reactant is delivered.

24. The method of claim 22, further comprising a fourth stage where the plasma is extinguished, the fourth stage occurring after the third stage, wherein the first, second, third, and fourth stages are cyclically repeated until the silicon-containing film reaches the final thickness.

25. The method of claim 22, wherein the substrate comprises an exposed layer that is sensitive to oxidation damage.

26. An apparatus for forming an etched feature in dielectric material on a semiconductor substrate, the apparatus comprising:

one or more reaction chambers, wherein at least one reaction chamber is designed or configured to perform etching, and wherein at least one reaction chamber is designed or configured to perform deposition, each reaction chamber comprising:

an inlet for introducing process gases to the reaction chamber, an outlet for removing material from the reaction chamber, and a plasma source; and a controller having instructions for:

(a) generating a first plasma comprising an etching reactant, exposing the substrate to the first plasma, and partially etching the feature in the dielectric material, wherein (a) is performed in the reaction chamber designed or configured to perform etching;

(b) after (a), depositing a protective film on sidewalls of the feature, wherein the protective film is deposited along substantially the entire depth of the feature, wherein (b) occurs while substantially preserving a mask layer on the substrate, wherein (b) is performed in the reaction chamber designed or configured to perform deposition, and wherein depositing the protective film comprises:

(i) flowing a first deposition reactant into the reaction chamber designed or configured to perform deposition, generating a deposition plasma comprising the first deposition reactant, and exposing the substrate to the deposition plasma, wherein the first deposition reactant is a silicon-containing reactant, (ii) ceasing the flow of the first deposition reactant, (iii) flowing a second deposition reactant into the reaction chamber designed or configured to perform deposition and generating or maintaining the deposition plasma to thereby drive a surface reaction between the first and second deposition reactants to form the protective film, the deposition plasma in (iii) comprising the second deposition reactant, wherein a composition of the deposition plasma changes over the course of (i)-(iii), (iv) ceasing the flow of the second deposition reactant, and (v) repeating (i)-(iv) until the protective film reaches a final thickness; and (c) repeating (a)-(b) until the feature is etched to a final depth, wherein the protective film deposited in (b) substantially prevents lateral etch of the feature during (a), and wherein the feature has an aspect ratio of about 5 or greater at its final depth.

27. The apparatus of claim 26, wherein the reaction chamber designed or configured to perform etching is the same reaction chamber designed or configured to perform deposition, such that both (a) and (b) occur in the same reaction chamber.

28. The apparatus of claim 26, wherein the reaction chamber designed or configured to perform etching is different from the reaction chamber designed or configured to perform deposition, and wherein the controller further comprises instructions to transfer the substrate between the reaction chamber designed or configured to perform etching and the reaction chamber designed or configured to perform deposition.

* * * * *

UNITED STATES PATENT AND TRADEMARK OFFICE
CERTIFICATE OF CORRECTION

PATENT NO.        : 9,543,158 B2                                        Page 1 of 1
APPLICATION NO.   : 14/697521
DATED             : January 10, 2017
INVENTOR(S)       : Eric A. Hudson et al.

It is certified that error appears in the above-identified patent and that said Letters Patent is hereby corrected as shown below:

On the Title Page

Item (63) please add Related U.S. Application Data:
--Continuation-in-part of application No. 14/560,414, filed on Dec. 4, 2014, now Pat. No. 9,378,971.--

Signed and Sealed this
Eighteenth Day of April, 2017

Michelle K. Lee
*Director of the United States Patent and Trademark Office*